(12) United States Patent
Rathburn

(10) Patent No.: US 8,789,272 B2
(45) Date of Patent: Jul. 29, 2014

(54) METHOD OF MAKING A COMPLIANT PRINTED CIRCUIT PERIPHERAL LEAD SEMICONDUCTOR TEST SOCKET

(75) Inventor: James Rathburn, Mound, MN (US)

(73) Assignee: HSIO Technologies, LLC, Maple Grove, MN (US)

( * ) Notice: Subject to any disclaimer, the term of this patent is extended or adjusted under 35 U.S.C. 154(b) by 333 days.

(21) Appl. No.: 13/318,171

(22) PCT Filed: May 27, 2010

(86) PCT No.: PCT/US2010/036397
§ 371 (c)(1),
(2), (4) Date: Oct. 31, 2011

(65) Prior Publication Data
US 2012/0049877 A1  Mar. 1, 2012

Related U.S. Application Data

(60) Provisional application No. 61/183,378, filed on Jun. 2, 2009.

(51) Int. Cl.
*H05K 3/02* (2006.01)
*H05K 3/10* (2006.01)
(52) U.S. Cl.
USPC ............... 29/846; 29/830; 29/831; 174/262
(58) Field of Classification Search
CPC .............. H01L 2924/00; H01L 2924/10253; H01L 2924/14; B23K 2201/40; H05K 2201/068
USPC ............ 29/830–832, 834, 846, 852; 174/255, 174/262; 438/15; 439/66
See application file for complete search history.

(56) References Cited

U.S. PATENT DOCUMENTS

| 3,672,986 A | 6/1972 | Schneble, Jr. et al. |
| 4,188,438 A | 2/1980 | Burns |
| 4,489,999 A | 12/1984 | Miniet |

(Continued)

FOREIGN PATENT DOCUMENTS

| JP | 2003/217774 | 7/2003 |
| WO | WO 91/14015 | 9/1991 |

(Continued)

OTHER PUBLICATIONS

Co-pending U.S. Appl. No. 13/575,368, titled High Speed Backplane Connector, filed Jul. 26, 2012.

(Continued)

*Primary Examiner* — Donghai D Nguyen
(74) *Attorney, Agent, or Firm* — Stoel Rives LLP

(57) ABSTRACT

A test socket that provides a temporary interconnect between terminals on an integrated circuit (IC) device and contact pads on a test printed circuit board (PCB). The test socket includes a compliant printed circuit and a socket housing. The compliant printed circuit includes at least one compliant layer, a plurality of first contact members located along a first major surface, a plurality of second contact members located along a second major surface, and a plurality of conductive traces electrically coupling the first and second contact members. The compliant layer is positioned to bias the first contact members against the terminals on the IC device and the second contact members against contact pads on the test PCB. The socket housing is coupled to the compliant printed circuit so the first contact members are positioned in a recess of the socket housing sized to receive the IC device.

17 Claims, 11 Drawing Sheets

(56) References Cited

U.S. PATENT DOCUMENTS

| | | | |
|---|---|---|---|
| 4,922,376 A | 5/1990 | Pommer et al. | |
| 4,964,948 A | 10/1990 | Reed | |
| 5,014,159 A | 5/1991 | Butt | |
| 5,072,520 A * | 12/1991 | Nelson | 29/852 |
| 5,127,837 A | 7/1992 | Shah et al. | |
| 5,161,983 A | 11/1992 | Ohno | |
| 5,208,068 A | 5/1993 | Davis et al. | |
| 5,237,203 A | 8/1993 | Massaron | |
| 5,246,880 A | 9/1993 | Reele et al. | |
| 5,286,680 A | 2/1994 | Cain | |
| 5,334,029 A | 8/1994 | Akkapeddi et al. | |
| 5,358,621 A | 10/1994 | Oyama | |
| 5,378,981 A | 1/1995 | Higgins, III | |
| 5,419,038 A | 5/1995 | Wang et al. | |
| 5,454,161 A | 10/1995 | Beilin et al. | |
| 5,479,319 A | 12/1995 | Werther et al. | |
| 5,509,019 A | 4/1996 | Yamamura | |
| 5,527,998 A | 6/1996 | Anderson et al. | |
| 5,562,462 A | 10/1996 | Matsuba et al. | |
| 5,659,181 A | 8/1997 | Bridenbaugh | |
| 5,674,595 A | 10/1997 | Busacco et al. | |
| 5,716,663 A | 2/1998 | Capote et al. | |
| 5,741,624 A | 4/1998 | Jeng et al. | |
| 5,761,801 A | 6/1998 | Gebhardt et al. | |
| 5,791,911 A | 8/1998 | Fasano et al. | |
| 5,802,711 A | 9/1998 | Card et al. | |
| 5,819,579 A | 10/1998 | Roberts | |
| 5,904,546 A | 5/1999 | Wood et al. | |
| 5,913,109 A | 6/1999 | Distefano et al. | |
| 5,925,931 A | 7/1999 | Yamamoto | |
| 5,933,558 A | 8/1999 | Sauvageau et al. | |
| 6,020,597 A | 2/2000 | Kwak | |
| 6,062,879 A | 5/2000 | Beaman et al. | |
| 6,080,932 A | 6/2000 | Smith et al. | |
| 6,118,426 A | 9/2000 | Albert | |
| 6,120,588 A | 9/2000 | Jacobson | |
| 6,172,879 B1 | 1/2001 | Cilia et al. | |
| 6,177,921 B1 | 1/2001 | Comiskey | |
| 6,178,540 B1 | 1/2001 | Lo et al. | |
| 6,181,144 B1 | 1/2001 | Hembree et al. | |
| 6,200,143 B1 | 3/2001 | Haba et al. | |
| 6,207,259 B1 | 3/2001 | Iino et al. | |
| 6,225,692 B1 | 5/2001 | Hinds | |
| 6,247,938 B1 | 6/2001 | Rathburn | |
| 6,252,564 B1 | 6/2001 | Albert | |
| 6,255,126 B1 * | 7/2001 | Mathieu et al. | 438/15 |
| 6,263,566 B1 | 7/2001 | Hembree et al. | |
| 6,270,363 B1 | 8/2001 | Brofman et al. | |
| 6,312,971 B1 | 11/2001 | Amundson | |
| 6,313,528 B1 | 11/2001 | Solberg | |
| 6,320,256 B1 | 11/2001 | Ho | |
| 6,350,386 B1 | 2/2002 | Lin | |
| 6,359,790 B1 | 3/2002 | Meyer-Berg | |
| 6,413,790 B1 | 7/2002 | Duthaler | |
| 6,422,687 B1 | 7/2002 | Jacobson | |
| 6,459,418 B1 | 10/2002 | Comiskey | |
| 6,461,183 B1 | 10/2002 | Ohkita | |
| 6,462,418 B2 | 10/2002 | Sakamoto et al. | |
| 6,477,286 B1 | 11/2002 | Ouchi | |
| 6,506,438 B2 | 1/2003 | Duthaler et al. | |
| 6,521,489 B2 | 2/2003 | Duthaler | |
| 6,545,291 B1 | 4/2003 | Amundson | |
| 6,574,114 B1 | 6/2003 | Brindle et al. | |
| 6,593,535 B2 | 7/2003 | Gailus | |
| 6,603,080 B2 | 8/2003 | Jensen | |
| 6,614,104 B2 | 9/2003 | Farnworth et al. | |
| 6,626,526 B2 | 9/2003 | Ueki | |
| 6,639,578 B1 | 10/2003 | Comiskey | |
| 6,642,127 B2 | 11/2003 | Kumar et al. | |
| 6,652,075 B2 | 11/2003 | Jacobson | |
| 6,661,084 B1 | 12/2003 | Peterson et al. | |
| 6,744,126 B1 | 6/2004 | Chiang | |
| 6,750,473 B2 | 6/2004 | Amundson | |
| 6,750,551 B1 | 6/2004 | Frutschy et al. | |
| 6,758,691 B1 | 7/2004 | McHugh | |
| 6,773,302 B2 | 8/2004 | Gutierrez et al. | |
| 6,800,169 B2 | 10/2004 | Liu et al. | |
| 6,809,414 B1 | 10/2004 | Lin et al. | |
| 6,821,131 B2 | 11/2004 | Suzuki et al. | |
| 6,823,124 B1 | 11/2004 | Renn | |
| 6,825,829 B1 | 11/2004 | Albert | |
| 6,827,611 B1 | 12/2004 | Payne et al. | |
| 6,830,460 B1 | 12/2004 | Rathburn | |
| 6,840,777 B2 | 1/2005 | Sathe et al. | |
| 6,861,345 B2 | 3/2005 | Ball et al. | |
| 6,910,897 B2 | 6/2005 | Driscoll et al. | |
| 6,946,325 B2 | 9/2005 | Yean et al. | |
| 6,965,168 B2 | 11/2005 | Langhorn | |
| 6,967,640 B2 | 11/2005 | Albert | |
| 6,971,902 B2 | 12/2005 | Taylor | |
| 6,992,376 B2 | 1/2006 | Jaeck | |
| 7,025,600 B2 | 4/2006 | Higashi | |
| 7,029,289 B2 | 4/2006 | Li | |
| 7,040,902 B2 | 5/2006 | Li | |
| 7,045,015 B2 | 5/2006 | Renn | |
| 7,095,090 B2 | 8/2006 | Nakajima et al. | |
| 7,101,210 B2 | 9/2006 | Lin | |
| 7,114,960 B2 | 10/2006 | Rathburn | |
| 7,118,391 B2 | 10/2006 | Minich et al. | |
| 7,121,837 B2 | 10/2006 | Sato et al. | |
| 7,121,839 B2 | 10/2006 | Rathburn | |
| 7,129,166 B2 | 10/2006 | Speakman | |
| 7,145,228 B2 | 12/2006 | Yean et al. | |
| 7,148,128 B2 | 12/2006 | Jacobson | |
| 7,154,175 B2 | 12/2006 | Shrivastava et al. | |
| 7,157,799 B2 | 1/2007 | Noquil et al. | |
| 7,217,996 B2 | 5/2007 | Cheng et al. | |
| 7,220,287 B1 | 5/2007 | Wyrzykowska et al. | |
| 7,229,293 B2 | 6/2007 | Sakurai et al. | |
| 7,244,967 B2 | 7/2007 | Hundt et al. | |
| 7,249,954 B2 | 7/2007 | Weiss | |
| 7,301,105 B2 | 11/2007 | Vasoya | |
| 7,321,168 B2 | 1/2008 | Tao | |
| 7,326,064 B2 | 2/2008 | Rathburn | |
| 7,327,006 B2 | 2/2008 | Svard et al. | |
| 7,382,363 B2 | 6/2008 | Albert et al. | |
| 7,402,515 B2 | 7/2008 | Arana et al. | |
| 7,410,825 B2 | 8/2008 | Majumdar et al. | |
| 7,411,304 B2 | 8/2008 | Kirby et al. | |
| 7,417,299 B2 | 8/2008 | Hu | |
| 7,417,314 B1 | 8/2008 | Lin et al. | |
| 7,422,439 B2 | 9/2008 | Rathburn et al. | |
| 7,423,219 B2 | 9/2008 | Kawaguchi et al. | |
| 7,432,600 B2 | 10/2008 | Klein et al. | |
| 7,458,150 B2 | 12/2008 | Totokawa et al. | |
| 7,459,393 B2 | 12/2008 | Farnworth et al. | |
| 7,485,345 B2 | 2/2009 | Renn | |
| 7,508,076 B2 | 3/2009 | Japp et al. | |
| 7,527,502 B2 | 5/2009 | Li | |
| 7,537,461 B2 | 5/2009 | Rathburn | |
| 7,538,415 B1 | 5/2009 | Lin et al. | |
| 7,548,430 B1 | 6/2009 | Huemoeller et al. | |
| 7,563,645 B2 | 7/2009 | Jaeck | |
| 7,595,454 B2 | 9/2009 | Kresge et al. | |
| 7,619,309 B2 | 11/2009 | Drexl et al. | |
| 7,621,761 B2 | 11/2009 | Mok et al. | |
| 7,632,106 B2 | 12/2009 | Nakamura | |
| 7,651,382 B2 | 1/2010 | Yasumura et al. | |
| 7,658,163 B2 | 2/2010 | Renn | |
| 7,674,671 B2 | 3/2010 | Renn | |
| 7,726,984 B2 | 6/2010 | Bumb et al. | |
| 7,748,110 B2 | 7/2010 | Asahi et al. | |
| 7,800,916 B2 | 9/2010 | Blackwell et al. | |
| 7,833,832 B2 | 11/2010 | Wood et al. | |
| 7,897,503 B2 | 3/2011 | Foster et al. | |
| 7,898,087 B2 | 3/2011 | Chainer | |
| 8,072,058 B2 | 12/2011 | Kim et al. | |
| 8,120,173 B2 | 2/2012 | Forman et al. | |
| 8,148,643 B2 | 4/2012 | Hirose et al. | |
| 8,154,119 B2 | 4/2012 | Yoon et al. | |
| 8,158,503 B2 | 4/2012 | Abe | |
| 8,159,824 B2 | 4/2012 | Cho et al. | |
| 8,232,632 B2 | 7/2012 | Rathburn | |
| 8,278,141 B2 | 10/2012 | Chow et al. | |

(56) References Cited

U.S. PATENT DOCUMENTS

| | | |
|---|---|---|
| 8,344,516 B2 | 1/2013 | Chainer |
| 8,373,428 B2 | 2/2013 | Eldridge et al. |
| 8,525,346 B2 | 9/2013 | Rathburn |
| 8,610,265 B2 | 12/2013 | Rathburn |
| 8,618,649 B2 | 12/2013 | Rathburn |
| 2001/0012707 A1 | 8/2001 | Ho et al. |
| 2001/0016551 A1 | 8/2001 | Yishio et al. |
| 2002/0011639 A1 | 1/2002 | Carlson et al. |
| 2002/0062200 A1 | 5/2002 | Mori et al. |
| 2002/0079912 A1 | 6/2002 | Shahriari et al. |
| 2002/0088116 A1 | 7/2002 | Milkovich et al. |
| 2002/0098740 A1 | 7/2002 | Ooya |
| 2002/0105080 A1 | 8/2002 | Speakman |
| 2002/0105087 A1 | 8/2002 | Forbes et al. |
| 2002/0160103 A1 | 10/2002 | Fukunaga et al. |
| 2003/0003779 A1 | 1/2003 | Rathburn |
| 2003/0114029 A1 | 6/2003 | Lee et al. |
| 2003/0117161 A1 | 6/2003 | Burns |
| 2003/0156400 A1 | 8/2003 | Dibene et al. |
| 2003/0162418 A1 | 8/2003 | Yamada |
| 2003/0188890 A1 | 10/2003 | Bhatt et al. |
| 2003/0189083 A1 | 10/2003 | Olsen |
| 2004/0016995 A1 | 1/2004 | Kuo et al. |
| 2004/0029411 A1 | 2/2004 | Rathburn |
| 2004/0048523 A1 | 3/2004 | Huang et al. |
| 2004/0054031 A1 | 3/2004 | Jacobson |
| 2004/0070042 A1 | 4/2004 | Lee et al. |
| 2004/0077190 A1 | 4/2004 | Huang et al. |
| 2004/0174180 A1 | 9/2004 | Fukushima et al. |
| 2004/0183557 A1 | 9/2004 | Akram |
| 2004/0184219 A1 | 9/2004 | Otsuka et al. |
| 2004/0217473 A1 | 11/2004 | Shen |
| 2004/0243348 A1 | 12/2004 | Minatani |
| 2005/0048680 A1 | 3/2005 | Matsunami |
| 2005/0100294 A1 | 5/2005 | Nguyen et al. |
| 2005/0101164 A1 | 5/2005 | Rathburn |
| 2005/0164527 A1 | 7/2005 | Radza et al. |
| 2006/0001152 A1 | 1/2006 | Hu |
| 2006/0006534 A1 | 1/2006 | Yean et al. |
| 2006/0012966 A1 | 1/2006 | Chakravorty |
| 2006/0024924 A1 | 2/2006 | Haji et al. |
| 2006/0044357 A1 | 3/2006 | Anderson |
| 2006/0087064 A1 | 4/2006 | Daniel et al. |
| 2006/0157103 A1 | 7/2006 | Sheats et al. |
| 2006/0160379 A1 | 7/2006 | Rathburn |
| 2006/0208230 A1 | 9/2006 | Cho et al. |
| 2006/0258912 A1 | 11/2006 | Belson et al. |
| 2006/0261827 A1 | 11/2006 | Cooper et al. |
| 2007/0021002 A1 | 1/2007 | Laurx et al. |
| 2007/0145981 A1 | 6/2007 | Tomita et al. |
| 2007/0148822 A1 | 6/2007 | Haba et al. |
| 2007/0170595 A1 | 7/2007 | Sinha |
| 2007/0221404 A1 | 9/2007 | Das et al. |
| 2007/0224735 A1 | 9/2007 | Karashima et al. |
| 2007/0232059 A1 | 10/2007 | Abe |
| 2007/0259539 A1 | 11/2007 | Brown et al. |
| 2007/0269999 A1 | 11/2007 | Di Stefano |
| 2007/0273394 A1 | 11/2007 | Tanner et al. |
| 2007/0289127 A1 | 12/2007 | Hurwitz et al. |
| 2007/0296090 A1 | 12/2007 | Hembree |
| 2008/0008822 A1 | 1/2008 | Kowalski |
| 2008/0020566 A1 | 1/2008 | Egitto et al. |
| 2008/0057753 A1 | 3/2008 | Rathburn et al. |
| 2008/0060838 A1 | 3/2008 | Chen et al. |
| 2008/0073110 A1 | 3/2008 | Shioga et al. |
| 2008/0093115 A1 | 4/2008 | Lee |
| 2008/0143358 A1 | 6/2008 | Breinlinger |
| 2008/0143367 A1 | 6/2008 | Chabineau-Lovgren |
| 2008/0156856 A1 | 7/2008 | Barausky et al. |
| 2008/0157361 A1 | 7/2008 | Wood et al. |
| 2008/0182436 A1 | 7/2008 | Rathburn |
| 2008/0185180 A1 | 8/2008 | Cheng et al. |
| 2008/0197867 A1 | 8/2008 | Wokhlu et al. |
| 2008/0220584 A1 | 9/2008 | Kim et al. |
| 2008/0241997 A1 | 10/2008 | Sunohara et al. |
| 2008/0246136 A1 | 10/2008 | Haba et al. |
| 2008/0248596 A1 | 10/2008 | Das et al. |
| 2008/0250363 A1 | 10/2008 | Goto et al. |
| 2008/0265919 A1 | 10/2008 | Izadian |
| 2008/0290885 A1 | 11/2008 | Matsunami |
| 2008/0309349 A1 | 12/2008 | Sutono |
| 2009/0058444 A1 | 3/2009 | Mcintyre |
| 2009/0061089 A1 | 3/2009 | King |
| 2009/0065918 A1 | 3/2009 | Murphy |
| 2009/0127698 A1 | 5/2009 | Rathburn |
| 2009/0133906 A1 | 5/2009 | Baek |
| 2009/0224404 A1 | 9/2009 | Wood et al. |
| 2009/0241332 A1 | 10/2009 | Lauffer et al. |
| 2009/0246136 A1 | 10/2009 | Williams et al. |
| 2009/0321915 A1 | 12/2009 | Hu et al. |
| 2010/0022105 A1 | 1/2010 | Di Stefano |
| 2010/0133680 A1 | 6/2010 | Kang et al. |
| 2011/0101540 A1 | 5/2011 | Chainer |
| 2012/0017437 A1 | 1/2012 | Das et al. |
| 2012/0043119 A1 | 2/2012 | Rathburn |
| 2012/0043130 A1 | 2/2012 | Rathburn |
| 2012/0043667 A1 | 2/2012 | Rathburn |
| 2012/0044659 A1 | 2/2012 | Rathburn |
| 2012/0049342 A1 | 3/2012 | Rathburn |
| 2012/0049877 A1 | 3/2012 | Rathburn |
| 2012/0051016 A1 | 3/2012 | Rathburn |
| 2012/0055701 A1 | 3/2012 | Rathburn |
| 2012/0055702 A1 | 3/2012 | Rathburn |
| 2012/0056332 A1 | 3/2012 | Rathburn |
| 2012/0056640 A1 | 3/2012 | Rathburn |
| 2012/0058653 A1 | 3/2012 | Rathburn |
| 2012/0061846 A1 | 3/2012 | Rathburn |
| 2012/0061851 A1 | 3/2012 | Rathburn |
| 2012/0068727 A1 | 3/2012 | Rathburn |
| 2012/0161317 A1 | 6/2012 | Rathburn |
| 2012/0164888 A1 | 6/2012 | Rathburn |
| 2012/0168948 A1 | 7/2012 | Rathburn |
| 2012/0171907 A1 | 7/2012 | Rathburn |
| 2012/0182035 A1 | 7/2012 | Rathburn |
| 2012/0199985 A1 | 8/2012 | Rathburn |
| 2012/0202364 A1 | 8/2012 | Rathburn |
| 2012/0244728 A1 | 9/2012 | Rathburn |
| 2012/0252164 A1 | 10/2012 | Nakao et al. |
| 2012/0257343 A1 | 10/2012 | Das et al. |
| 2012/0268155 A1 | 10/2012 | Rathburn |
| 2013/0078860 A1 | 3/2013 | Rathburn |
| 2013/0105984 A1 | 5/2013 | Rathburn |
| 2013/0203273 A1 | 8/2013 | Rathburn |
| 2013/0206468 A1 | 8/2013 | Rathburn |
| 2013/0210276 A1 | 8/2013 | Rathburn |
| 2013/0223034 A1 | 8/2013 | Rathburn |
| 2013/0244490 A1 | 9/2013 | Rathburn |
| 2013/0330942 A1 | 12/2013 | Rathburn |
| 2014/0043782 A1 | 2/2014 | Rathburn |

FOREIGN PATENT DOCUMENTS

| | | |
|---|---|---|
| WO | WO 2006/039277 | 4/2006 |
| WO | WO 2006/124597 | 11/2006 |
| WO | WO 2008/156856 | 12/2008 |
| WO | WO 2010/138493 | 12/2010 |
| WO | WO 2010/141264 | 12/2010 |
| WO | WO 2010/141266 | 12/2010 |
| WO | WO 2010/141295 | 12/2010 |
| WO | WO 2010/141296 | 12/2010 |
| WO | WO 2010/141297 | 12/2010 |
| WO | WO 2010/141298 | 12/2010 |
| WO | WO 2010/141303 | 12/2010 |
| WO | WO 2010/141311 | 12/2010 |
| WO | WO 2010/141313 | 12/2010 |
| WO | WO 2010/141316 | 12/2010 |
| WO | WO 2010/141318 | 12/2010 |
| WO | WO 2010/147782 | 12/2010 |
| WO | WO 2010/147934 | 12/2010 |
| WO | WO 2010/147939 | 12/2010 |
| WO | WO 2011/002709 | 1/2011 |
| WO | WO 2011/002712 | 1/2011 |
| WO | WO 2011/097160 | 8/2011 |
| WO | WO 2011/139619 | 11/2011 |

(56) References Cited

FOREIGN PATENT DOCUMENTS

| WO | WO 2011/153298   | 12/2011 |
|----|------------------|---------|
| WO | WO-2012/061008   | 5/2012  |
| WO | WO-2012/074963   | 6/2012  |
| WO | WO-2012/074969   | 6/2012  |
| WO | WO-2012/078493   | 6/2012  |
| WO | WO 2012/122142   | 9/2012  |
| WO | WO 2012/125331   | 9/2012  |
| WO | WO 2013/036565   | 3/2013  |
| WO | WO-2014/011226   | 1/2014  |
| WO | WO-2014/011228   | 1/2014  |
| WO | WO-2014/011232   | 1/2014  |

OTHER PUBLICATIONS

Notification of Transmittal of the International Search Report and the Written Opinion of the International Searching Authority issued Jul. 30, 2010 in International Application No. PCT/US2010/036043.
Notification of Transmittal of the International Search Report and the Written Opinion of the International Searching Authority issued Jul. 21, 2010 in International Application No. PCT/US2010/036047.
Notification of Transmittal of the International Search Report and the Written Opinion of the International Searching Authority issued Jul. 28, 2010 in International Application No. PCT/US2010/036363.
Notification of Transmittal of the International Search Report and the Written Opinion of the International Searching Authority issued Jul. 28, 2010 in International Application No. PCT/US2010/036377.
Notification of Transmittal of the International Search Report and the Written Opinion of the International Searching Authority issued Jul. 30, 2010 in International Application No. PCT/US2010/036388.
Notification of Transmittal of the International Search Report and the Written Opinion of the International Searching Authority issued Jul. 27, 2010 in International Application No. PCT/US2010/036397.
Notification of Transmittal of the International Search Report and the Written Opinion of the International Searching Authority issued Jul. 30, 2010 in International Application No. PCT/US2010/036055.
Notification of Transmittal of the International Search Report and the Written Opinion of the International Searching Authority issued Aug. 4, 2010 in International Application No. PCT/US2010/036288.
Notification of Transmittal of the International Search Report and the Written Opinion of the International Searching Authority issued Aug. 4, 2010 in International Application No. PCT/US2010/036285.
Notification of Transmittal of the International Search Report and the Written Opinion of the International Searching Authority issued Jul. 30, 2010 in International Application No. PCT/US2010/036282.
Notification of Transmittal of the International Search Report and the Written Opinion of the International Searching Authority issued Jul. 30, 2010 in International Application No. PCT/US2010/036295.
Notification of Transmittal of the International Search Report and the Written Opinion of the International Searching Authority issued Jul. 30, 2010 in International Application No. PCT/US2010/036313.
Notification of Transmittal of the International Search Report and the Written Opinion of the International Searching Authority issued Aug. 3, 2010 in International Application No. PCT/US2010/037619.
Notification of Transmittal of the International Search Report and the Written Opinion of the International Searching Authority issued Sep. 7, 2010 in International Application No. PCT/US2010/038600.
Notification of Transmittal of the International Search Report and the Written Opinion of the International Searching Authority issued Aug. 18, 2010 in International Application No. PCT/US2010/038606.
Notification of Transmittal of the International Search Report and the Written Opinion of the International Searching Authority issued Sep. 1, 2010 in International Application No. PCT/US2010/040188.
Notification of Transmittal of the International Search Report and the Written Opinion of the International Searching Authority issued Aug. 20, 2010 in International Application No. PCT/US2010/040197.
Notification of Transmittal of the International Search Report and the Written Opinion of the International Searching Authority issued Apr. 14, 2011 in International Application No. PCT/US2010/023138.
Notification of Transmittal of the International Search Report and the Written Opinion of the International Searching Authority issued Aug. 17, 2011 in International Application No. PCT/US2010/033726.
Notification of Transmittal of the International Search Report and the Written Opinion of the International Searching Authority issued Sep. 27, 2011 in International Application No. PCT/US2010/038845.
Co-pending U.S. Appl. No. 13/266,486, titled High Performance Surface Mount Electrical Interconnect, filed Oct. 27, 2011.
Co-pending U.S. Appl. No. 13/266,522, titled Compliant Wafer Level Probe Assembly, filed Oct. 27, 2011.
Co-pending U.S. Appl. No. 13/266,573, titled Compliant Printed Circuit Area Array Semiconductor Device Package, filed Oct. 27, 2011.
Co-pending U.S. Appl. No. 13/266,907, titled Compliant Printed Circuit Socket Diagnostic Tool, filed Oct. 28, 2011.
Co-pending U.S. Appl. No. 13/318,171, titled Compliant Printed Circuit Peripheral Lead Semiconductor Test Socket, filed Oct. 31, 2011.
Co-pending U.S. Appl. No. 13/318,181, titled Compliant Printed Circuit Peripheral Lead Semiconductor Package, filed Oct. 31, 2011.
Co-pending U.S. Appl. No. 13/318,200, titled Compliant Printed Circuit Wafer Level Semiconductor Package, filed Oct. 31, 2011.
Co-pending U.S. Appl. No. 13/318,263, titled Compliant Printed Circuit Semiconductor Package, filed Oct. 31, 2011.
Co-pending U.S. Appl. No. 13/320,285, titled Compliant Printed Flexible Circuit, filed Nov. 14, 2011.
Co-pending U.S. Appl. No. 13/318,369, titled Composite Polymer-Metal Electrical Contacts, filed Nov. 1, 2011.
Co-pending U.S. Appl. No. 13/318,382, titled Resilient Conductive Electrical Interconnect, filed Nov. 1, 2011.
Co-pending U.S. Appl. No. 13/319,120, titled Simulated Wirebond Semiconductive Package, filed Nov. 7, 2011.
Co-pending U.S. Appl. No. 13/319,145, titled Semiconductor Die Terminal, filed Nov. 7, 2011.
Co-pending U.S. Appl. No. 13/319,158, titled Semiconductor Socket, filed Nov. 7, 2011.
Co-pending U.S. Appl. No. 13/319,203, titled Compliant Printed Circuit Semiconductor Tester Interface, filed Nov. 7, 2011.
Co-pending U.S. Appl. No. 13/319,228, titled Singulated Semiconductor Device Separable Electrical Interconnect, filed Nov. 7, 2011.
Office Action mailed Oct. 30, 2013 in co-pending U.S. Appl. No. 13/266,486, now published as US Patent Application Publication No. US 2012/0055701.
Amendment and Response filed Nov. 6, 2013 in co-pending U.S. Appl. No. 13/266,486, now published as US Patent Application Publication No. US 2012/0055701.
Notice of Non-Compliant Amended mailed Nov. 15, 2013 in co-pending U.S. Appl. No. 13/266,486, now published as US Patent Application Publication No. US 2012/0055701.
Response and Examiner's Interview Summary filed Nov. 20, 2013 in co-pending U.S. Appl. No. 13/266,486, now published as US Patent Application Publication No. US 2012/0055701.
Response to Restriction Requirement filed Oct. 7, 2013 in co-pending U.S. Appl. No. 13/266,573, now published as US Patent Application Publication No. 2012/0061846.
Office Action mailed Nov. 22, 2013 in co-pending U.S. Appl. No. 13/266,907, now published as US Patent Application Publication No. US 2012/0268155.
Restriction Requirement mailed Dec. 9, 2013 in co-pending U.S. Appl. No. 13/318,171, now published as US Patent Application Publication No. US 2012/0049877.
Response to Restriction Requirement filed Dec. 17, 2013 in co-pending U.S. Appl. No. 13/318,171, now published as US Patent Application Publication No. US 2012/0049877.
Restriction Requirement mailed Dec. 9, 2013 in co-pending U.S. Appl. No. 13/318,181, now published as US Patent Application Publication No. US 2012/0044659.
Final Office Action mailed Nov. 6, 2013 in co-pending U.S. Appl. No. 13/318,200, now published as US Patent Application Publication No. US 2012/0056332.
Amendment and Response to Final Office Action filed Nov. 26, 2013 in co-pending U.S. Appl. No. 13/318,200, now published as US Patent Application Publication No. US 2012/0056332.

(56) References Cited

OTHER PUBLICATIONS

Advisory Action mailed Dec. 6, 2013 in co-pending U.S. Appl. No. 13/318,200, now published as US Patent Application Publication No. US 2012/0056332.
Notice of Allowance mailed Oct. 28, 2013 in co-pending U.S. Appl. No. 13/318,263, now published as US Patent Application Publication No. US 2012/0043667.
Office Action mailed Sep. 10, 2013 in co-pending U.S. Appl. No. 13/320,285, now published as US Patent Application Publication No. US 2012/0055702.
Amendment and Response filed Oct. 2, 2013 in co-pending U.S. Appl. No. 13/320,285, now published as US Patent Application Publication No. US 2012/0055702.
Response to Restriction Requirement filed Oct. 8, 2013 in co-pending U.S. Appl. No. 13/319,120 now published as US Patent Application Publication No. US 2012/0061851.
Notice of Non-Compliant Amendment mailed Oct. 15, 2013 in co-pending U.S. Appl. No. 13/319,120 now published as US Patent Application Publication No. US 2012/0061851.
Response to Restriction Requirement filed Oct. 18, 2013 in co-pending U.S. Appl. No. 13/319,120 now published as US Patent Application Publication No. US 2012/0061851.
Office Action mailed Dec. 16, 2013 in co-pending U.S. Appl. No. 13/410,914, now published as US Patent Application Publication No. US 2012/0164888.
Office Action mailed Nov. 7, 2013 in co-pending U.S. Appl. No. 13/412,870, now published as US Patent Application Publication No. US 2012/0171907.
Amendment and Response filed Dec. 10, 2013 in co-pending U.S. Appl. No. 13/412,870, now published as US Patent Application Publication No. US 2012/0171907.
Amendment and Response and Terminal Disclaimer filed Nov. 20, 2013 in co-pending U.S. Appl. No. 13/413,724, now published as US Patent Application Publication No. US 2012/0168948.
Notice of Allowance and Fee(s) Due mailed Dec. 6, 2013 in co-pending U.S. Appl. No. 14/058,863.
Office Action mailed Oct. 7, 2013 in co-pending U.S. Appl. No. 13/969,953, now published as US Patent Application Publication No. US 2013/0330942.
Amendment and Response and Terminal Disclaimer filed Nov. 20, 2013 in co-pending U.S. Appl. No. 13/969,953, now published as US Patent Application Publication No. US 2013/0330942.
Final Office Action mailed Dec. 20, 2013 in co-pending U.S. Appl. No. 13/969,953, now published as US Patent Application Publication No. US 2013/0330942.
Co-pending U.S. Appl. No. 14/058,863 titled Compliant Core Peripheral Lead Semiconductor Socket, filed Oct. 21, 2013.
Co-pending U.S. Appl. No. 14/086,029 titled Compliant Printed Circuit Semiconductor Package, filed Nov. 21, 2013.
Notification of Transmittal of the International Search Report and the Written Opinion of the International Searching Authority mailed Nov. 29, 2012 in International Application No. PCT/US2012/053848.
Tarzwell, Robert, "A Real Printed Electronic Replacement for Pcb Fabrication," PCB007 Magazine, May 19, 2009.
Tarzwell, Robert, "Green PCB Manufacturing Announced," Electrical Engineering Times, May 18, 2009.
Tarzwell, Robert, "Can Printed Electronics Replace PCB Technology?" PCB007 Magazine, May 14, 2009.
Tarzwell, Robert, "The Bleeding Edge: Printed Electronics, Inkjets and Silver Ink," PCB007 Magazine, May 6, 2009.
Tarzwell, Robert, "Integrating Printed Electronics and PCB Technologies," Printed Electronics World, Jul. 14, 2009.
Tarzwell, Robert, "Printed Electronics: the Next Generation of PCBs?" PCB007 Magazine, Apr. 28, 2009.
Restriction Requirement mailed Nov. 23, 2012 in co-pending U.S. Appl. No. 13/318,263, now published as US Patent Application Publication No. US 2012/0043667.
Co-pending U.S. Appl. No. 13/643,436 titled Semiconductor Device Package Adapter, filed Oct. 25, 2012.
Co-pending U.S. Appl. No. 13/700,639 titled Electrical Connector Insulator Housing, filed Nov. 28, 2012.
Liu, et al, "All-Polymer Capacitor Fabricated with Inkjet Printing Technique," Solid-State Electronics, vol. 47, pp. 1543-1548 (2003).
Notification of Transmittal of the International Search Report and the Written Opinion of the International Searching Authority mailed Jun. 7, 2013 in International Application No. PCT/US2013/030856.
Notification of Transmittal of the International Search Report and the Written Opinion of the International Searching Authority mailed Jun. 19, 2013 in International Application No. PCT/US2013/030981.
Notification of Transmittal of the International Search Report and the Written Opinion of the International Searching Authority mailed Jun. 3, 2013 in International Application No. PCT/US2013/031395.
Restriction Requirement mailed Jun. 13, 2013 in co-pending U.S. Appl. No. 13/266,486, now published as US Patent Application Publication No. US 2012/0055701.
Office Communication mailed May 30, 2013 in co-pending U.S. Appl. No. 13/318,200, now published as US Patent Application Publication No. US 2012/0056332.
Office Action mailed May 30, 2013 in co-pending U.S. Appl. No. 13/318,200, now published as US Patent Application Publication No. US 2012/0056332.
Amendment and Response filed Jul. 1, 2013 in co-pending U.S. Appl. No. 13/318,200, now published as US Patent Application Publication No. US 2012/0056332.
Examiner-Initiated Interview Summary mailed Mar. 14, 2013 in co-pending U.S. Appl. No. 13/319,228, now published as US Patent Application Publication No. US 2012/0058653.
Office Action mailed Apr. 30, 2013 in co-pending U.S. Appl. No. 13/413,724, now published as US Patent Application Publication No. US 2012/0168948.
Amendment and Response filed May 7, 2013 in co-pending U.S. Appl. No. 13/413,724, now published as US Patent Application Publication No. US 2012/0168948.
Notice of Non-Compliant Amendment mailed May 16, 2013 in co-pending U.S. Appl. No. 13/413,724, now published as US Patent Application Publication No. US 2012/0168948.
Revised Amendment and Response filed May 17, 2013 in co-pending U.S. Appl. No. 13/413,724, now published as US Patent Application Publication No. US 2012/0168948.
Office Action mailed May 9, 2013 in co-pending U.S. Appl. No. 13/448,914, now published as US Patent Application Publication No. US 2012/0202364.
Amendment and Response filed May 20, 2013 in co-pending U.S. Appl. No. 13/448,914, now published as US Patent Application Publication No. US 2012/0202364.
Response to Restriction Requirement filed Jul. 15, 2013 in co-pending U.S. Appl. No. 13/266,573, now published as US Patent Application Publication No. 2012/0061846.
Restriction Requirement mailed Sep. 25, 2013 in co-pending U.S. Appl. No. 13/266,486, now published as US Patent Application Publication No. US 2012/0055701.
Response to Restriction Requirement and Amendment to the Claims filed Oct. 2, 2013 in co-pending U.S. Appl. No. 13/266,486, now published as US Patent Application Publication No. US 2012/0164888.
Office Action mailed Jul. 10, 2013 in co-pending U.S. Appl. No. 13/318,263, now published as US Patent Application Publication No. US 2012/0043667.
Amendment and Response filed Sep. 24, 2013 in co-pending U.S. Appl. No. 13/318,263, now published as US Patent Application Publication No. US 2012/0043667.
Notice of Allowance and Fee(s) Due mailed Jul. 17, 2013 in co-pending U.S. Appl. No. 13/448,914, now published as US Patent Application Publication No. US 2012/0202364.
Restriction Requirement mailed Sep. 9, 2013 in co-pending U.S. Appl. No. 13/410,914, now published as US Patent Application Publication No. US 2012/0164888.
Response to Restriction Requirement and Amendment to the Claims filed Sep. 25, 2013 in co-pending U.S. Appl. No. 13/410,914, now published as US Patent Application Publication No. US 2012/0164888.

(56) References Cited

OTHER PUBLICATIONS

Office Action mailed Sep. 16, 2013 in co-pending U.S. Appl. No. 13/413,724, now published as US Patent Application Publication No. US 2012/0168948.
Restriction Requirement mailed Sep. 26, 2013 in co-pending U.S. Appl. No. 13/319,120 now published as US Patent Application Publication No. US 2012/0061851.
Notice of Allowance and Fee(s) Due mailed Oct. 2, 2013 in co-pending U.S. Appl. No. 13/448,865, now published as US Patent Application Publication No. US 2012/0199985.
Restriction Requirement mailed Oct. 1, 2013 in co-pending U.S. Appl. No. 13/266,573, now published as US Patent Application Publication No. 2012/0061846.
Restriction Requirement mailed Oct. 1, 2013 in co-pending U.S. Appl. No. 13/319,145, now published as US Patent Application Publication No. 2012/0049342.
Co-pending U.S. Appl. No. 13/969,953 titled Compliant Conductive Nano-Particle Electrical Interconnect, filed Aug. 19, 2013.
Notification of Transmittal of the International Search Report and the Written Opinion of the International Searching Authority mailed Apr. 5, 2012 in International Application No. PCT/US2011/062321.
Notification of Transmittal of the International Search Report and the Written Opinion of the International Searching Authority mailed Mar. 29, 2012 in International Application No. PCT/US2011/063247.
Notification of Transmittal of the International Search Report and the Written Opinion of the International Searching Authority mailed Jun. 20, 2012 in International Application No. PCT/US2012/027813.
Notification of Transmittal of the International Search Report and the Written Opinion of the International Searching Authority mailed Jun. 19, 2012 in International Application No. PCT/US2012/027823.
Co-pending U.S. Appl. No. 13/448,865, titled Compliant Conductive Nano-Particle Electrical Interconnect, filed Apr. 17, 2012.
Co-pending U.S. Appl. No. 13/448,914, titled Compliant Core Peripheral Lead Semiconductor Test Socket, filed Apr. 17, 2012.
Restriction Requirement mailed Mar. 1, 2013 in co-pending U.S. Appl. No. 13/318,200, now published as US Patent Application Publication No. US 2012/0056332.
Response to Restriction Requirement filed Mar. 7, 3013 in co-pending U.S. Appl. No. 13/318,200, now published as US Patent Application Publication No. US 2012/0056332.
Amendment and Response filed Mar. 4, 2013 in co-pending U.S. Appl. No. 13/318,263, now published as US Patent Application Publication No. US 2012/0043667.
Co-pending U.S. Appl. No. 13/879,783 titled High Performance Electrical Circuit Structure, filed Apr. 16, 2013.
Co-pending U.S. Appl. No. 13/879,883 titled High Performance Surface Mount Electrical Interconnect, filed Apr. 17, 2013.
Co-pending U.S. Appl. No. 13/880,231 titled Electrical Interconnect IC Device Socket, filed Apr. 18, 2013.
Co-pending U.S. Appl. No. 13/880,461 titled Electrical Interconnect IC Device Socket, filed Apr. 19, 2013.
Notification of Transmittal of the International Search Report and the Written Opinion of the International Searching Authority mailed Feb. 8, 2012 in International Application No. PCT/US2011/0.
Notification of Transmittal of the International Search Report and the Written Opinion of the International Searching Authority mailed Mar. 26, 2012 in International Application No. PCT/US2011/062313.
Co-pending U.S. Appl. No. 13/410,914, titled Metalized Pad to Electrical Contact Interface, filed Mar. 2, 2012.
Co-pending U.S. Appl. No. 13/410,943, titled Area Array Semiconductor Device Package Interconnect Structure With Optional Package-To-Package or Flexible Circuit to Package Connection, filed Mar. 2, 2012.
Co-pending U.S. Appl. No. 13/412,870, titled Selective Metalization of Electrical Connector or Socket Housing, filed Mar. 6, 2012.
Co-pending U.S. Appl. No. 13/413,032, titled Bumped Semiconductor Wafer or Die Level Electrical Interconnect, filed Mar. 6, 2012.
Co-pending U.S. Appl. No. 13/413,724, titled Copper Pillar Full Metal Via Electrical Circuit Structure, filed Mar. 7, 2012.
Co-pending U.S. Appl. No. 13/418,853, titled High Performance Surface Mount Electrical Interconnect With External Biased Normal Force Loading, filed Mar. 13, 2012.
Office Action mailed Feb. 21, 2014 in co-pending U.S. Appl. No. 13/266,573, now published as US Patent Application Publication No. 2012/0061846.
Amendment and Response filed Feb. 26, 2014 in co-pending U.S. Appl. No. 13/266,573, now published as US Patent Application Publication No. 2012/0061846.
Amendment and Response filed Jan. 3, 2014 in co-pending U.S. Appl. No. 13/266,907, now published as US Patent Application Publication No. US 2012/0268155.
Supplemental Amendment and Response filed Jan. 29, 2014 in co-pending U.S. Appl. No. 13/266,907, now published as US Patent Application Publication No. US 2012/0268155.
Office Action mailed Jan. 3, 2014 in co-pending U.S. Appl. No. 13/318,038, now published as US Patent Application Publication No. US 2012/0062270.
Response Restriction Requirement filed Jan. 28, 2014 in co-pending U.S. Appl. No. 13/318,181, now published as US Patent Application Publication No. US 2012/0044659.
Response to Advisory Action filed Dec. 6, 2013 in co-pending U.S. Appl. No. 13/318,200, now published as US Patent Application Publication No. US 2012/0056332.
Request for Continued Examination filed Feb. 11, 2014 in co-pending U.S. Appl. No. 13/318,200, now published as US Patent Application Publication No. US 2012/0056332.
Final Office Action mailed Jan. 8, 2014 in co-pending U.S. Appl. No. 13/320,285, now published as US Patent Application Publication No. US 2012/0055702.
Amendment and Response to Final Office filed Feb. 18, 2014 in co-pending U.S. Appl. No. 13/320,285, now published as US Patent Application Publication No. US 2012/0055702.
Advisory Action mailed Feb. 26, 2014 in co-pending U.S. Appl. No. 13/320,285, now published as US Patent Application Publication No. US 2012/0055702.
Office Action mailed Jan. 17, 2014 in co-pending U.S. Appl. No. 13/319,120 now published as US Patent Application Publication No. US 2012/0061851.
Office Action mailed Dec. 26, 2013 in co-pending U.S. Appl. No. 13/319,145, now published as US Patent Application Publication No. 2012/0049342.
Restriction Requirement mailed Jan. 30, 2014 in co-pending U.S. Appl. No. 13/319,158, now published as US Patent Application Publication No. 2012/0051016.
Response to Restriction Requirement filed Feb. 6, 2014 in co-pending U.S. Appl. No. 13/319,158, now published as US Patent Application Publication No. 2012/0051016.
Office Action mailed Feb. 27, 2014 in co-pending U.S. Appl. No. 13/319,203, now published as US Patent Application Publication No. 2012/0056640.
Restriction Requirement mailed Feb. 7, 2014 in co-pending U.S. Appl. No. 13/575,368, now published as US Patent Application Publication No. 2013/0203273.
Response to Restriction Requirement filed Feb. 19, 2014 in co-pending U.S. Appl. No. 13/575,368, now published as US Patent Application Publication No. 2013/0203273.
Office Action mailed Mar. 4, 2014 in co-pending U.S. Appl. No. 13/575,368, now published as US Patent Application Publication No. 2013/0203273.
Notice of Allowance and Fee(s) Due mailed Feb. 26, 2014 in co-pending U.S. Appl. No. 13/412,870, now published as US Patent Application Publication No. US 201 2/01 71 907.

(56) References Cited

OTHER PUBLICATIONS

Final Office Action mailed Feb. 14, 2014 in co-pending U.S. Appl. No. 13/413,724, now published as US Patent Application Publication No. US 2012/0168948.

Amendment and Response to Final Office filed Feb. 26, 2014 in co-pending U.S. Appl. No. 13/413,724, now published as US Patent Application Publication No. US 2012/0168948.

Amendment and Response to Final Office filed Dec. 30, 2013 in co-pending U.S. Appl. No. 13/969,953, now published as US Patent Application Publication No. US 2013/0330942.

Notice of Allowance and Fee(s) Due mailed Jan. 22, 2014 in co-pending U.S. Appl. No. 13/969,953, now published as US Patent Application Publication No. US 2013/0330942.

Co-pending U.S. Appl. No. 14/238,638 titled Direct Metalization of Electrical Circuit Structure, filed Feb. 12, 2014.

* cited by examiner

US 8,789,272 B2

METHOD OF MAKING A COMPLIANT PRINTED CIRCUIT PERIPHERAL LEAD SEMICONDUCTOR TEST SOCKET

CROSS-REFERENCE TO RELATED APPLICATIONS

This application is a national stage application under 35 U.S.C. §371 of International Application No. PCT/US2010/036397, titled COMPLIANT PRINTED CIRCUIT PERIPHERAL LEAD SEMICONDUCTOR TEST SOCKET, filed May 27, 2010, which claims priority to U.S. Provisional Application No. 61/183,378, filed Jun. 2, 2009, both of which are hereby incorporated by reference in their entireties.

FIELD OF THE INVENTION

The present disclosure relates to a high performance electrical interconnect between an integrated circuit and a printed circuit assembly, and in particular, to a peripheral lead semiconductor test socket.

BACKGROUND OF THE INVENTION

Traditional peripheral lead integrated circuit (IC) test sockets are generally constructed of a machined engineering grade plastic housing and frame, which is populated with a series of contact members that correspond to the terminals on two or four sides of the IC device. These contacts provide a temporary connection between the IC device terminals and the appropriate location on a test printed circuit board (PCB), also called a test or load board. This temporary electrical connection provides the mechanism to power the IC device and test performance.

The IC devices are graded based upon performance, and the devices that pass are identified while the devices that fail are either retested or discarded. In many cases, the performance windows in which the IC devices must operate can be fairly precise. Accordingly, the electrical performance of the contact members in the socket are important so as to not introduce degradation in signal or power delivery. A socket with good electrical performance is critical for many IC testing functions since poor performance can result in retesting or discarding devices that are actually acceptable but failed the test due to degradation within the socket.

IC manufacturers and their sub-contractors test millions or even billions of devices, and it is important for the socket to not only perform well electrically, but to also be mechanically robust enough to last hundreds of thousands of test cycles before being replaced. Many of the traditional sockets utilize very small metal contacts that are biased using elastomers. These contact members are mechanically compressed as the device is pushed against the contacts. An elastomeric material functions like a spring and provides the normal force to return the contact to the original position. The elastomeric material functioning as a spring member allows the contact members to be much shorter than they otherwise would have to be in order to fashion a spring in conjunction with a contact member. The short length provides an electrical path that has fewer distortion effects as the current or signal passes through the contact. In some cases, spring probes are used which contain opposing metal contacts that are biased by a coil spring.

There are a wide range of contact types used in traditional sockets. In general, they all have a range of mechanical life that is limited by the effects of contacting the solder that is plated onto the terminals of the IC device. As the solder collects on the tips of the contacts, the Tin within the solder oxidizes to form a high resistance layer that causes the contact to lose electrical performance.

In some cases, the contacts move with respect to the interface to the circuit board as the device actuates the contact. This movement can cause wear on the PCB which can degrade performance of the circuit board. In general, the need for thousands of cycles before replacement drives sophisticated design that can be expensive. The socket volumes can also be relatively small requiring custom production methods that can also be expensive. The methods used to produce the plastic socket housings which hold the contacts are typically expensive precision machining operations. Many of the sockets are assembled by hand, where the elastomeric members and contacts are inserted by hand under magnification.

Socket users typically look for the best mix of electrical performance, yield, cost, and mechanical life to determine the costs to test each IC device. Electrical performance can be a hurdle that eliminates many of the socket options. Those sockets that can pass the electrical performance requirements can be limited by cost or the amount of use before they must be repaired or replaced. It can take hours or days to replace the failing socket, with the corresponding unit volume of IC devices which could have been tested being a major factor in the overall cost of use (e.g., an opportunity cost). Damage to the PCB used for the test interface can also dramatically impact the cost of use as the PCB's can be very expensive and have a long lead-time to build (and replace).

BRIEF SUMMARY OF THE INVENTION

The present disclosure is aimed at a test socket that is inexpensive to produce, has relative long life and provides excellent electrical performance.

The present disclosure leverages the capabilities of precision additive printed circuit fabrication techniques to create a compliant printed circuit that is designed to interface to a test board and make temporary electrical contact to the terminal on an IC device. In basic terms, contact points can be created and positioned in the desired location relative to the points of contact to the PCB and the IC device terminals. A series of printing and sintering techniques can be employed to create a very precise and short electrical path. The contact members can be supported and biased by compliant materials that can be printed in an appropriate location to provide the desired effect when compressed. The nature of the compliant printed circuit fabrication process allows for many electrical enhancements not possible with traditional socket fabrication and testing techniques.

The disclosed compliant printed circuit fabrication process can allow for very high frequency performance, as well as the addition of on-board electrical devices and circuitry planes that are not available with other test sockets. The production cost for test sockets in accordance with the present disclosure can be a fraction the cost of producing existing test sockets. Use of additive printing processes, such as for example to print electrical features, can reduce capital cost and lead time for building the present test sockets. The additive printing processes can also increase yields over conventional test sockets that rely on conventional lithography tools and masks.

Internal compliance of the entire test socket and of individual contact members on the compliant printed circuit greatly increases performance of the present test sockets. The ability to build multi-layer structures over a relatively large area can permit terminal pitch on the IC devices to be reduced. The addition of circuitry planes and electrical devices in the present test sockets can provide performance enhancements not available with current test sockets. The ability to add electrical devices, such as transistors and memory, to the present test socket can provide the opportunity to incorporate test intelligence, extending the use of legacy test equipment and improving test performance. The present test sockets can provide the opportunity to develop adaptive testing and to alter the IC devices during testing.

The use of additive printing processes can permit the material set in a given layer to vary. Traditional PCB and circuit fabrication methods take sheets of material and stack them up, laminate, and/or drill. The materials in each layer are limited to the materials in a particular sheet. Additive printing technologies permit a wide variety of materials to be applied on a layer with a registration relative to the features of the previous layer. Selective addition of conductive, non-conductive, or semi-conductive materials at precise locations to create a desired effect can provide advantages in tuning impedance or adding electrical function on a given layer. Tuning performance on a layer by layer basis relative to the previous layer can greatly enhance electrical performance.

The resulting circuit geometry preferably has conductive traces that have substantially rectangular cross-sectional shapes, corresponding to recesses in a previously deposited layer. The use of additive printing processes permit conductive material, non-conductive material, and semi-conductive material to be deposited and positioned on a single layer.

In one embodiment, pre-formed conductive trace materials are located in the recesses. The recesses can be plated to form conductive traces with substantially rectangular cross-sectional shapes. In another embodiment, a conductive foil is pressed into at least a portion of the recesses. The conductive foil is sheared along edges of the recesses. The excess conductive foil not located in the recesses is removed and the recesses are plated to form conductive traces with substantially rectangular cross-sectional shapes.

One embodiment of the present disclosure is directed to a test socket providing a temporary interconnect between terminals on an IC device and contact pads on a test PCB. The test socket can include a compliant printed circuit and a socket housing. The compliant printed circuit can include at least one compliant layer, a plurality of first contact members located along a first major surface, a plurality of second contact members located along a second major surface, and a plurality of conductive traces electrically coupling a plurality of the first and second contact members. The compliant layer is positioned to bias the first contact members against the terminals on the IC device and the second contact members against contact pads on the test PCB. The socket housing is coupled to the compliant printed circuit so the first contact members are positioned in a recess of the socket housing sized to receive the IC device.

A base layer of a dielectric material can be optionally printed onto the first and/or second major surfaces of the compliant printed circuit. The compliant printed circuit can include at least one additional circuitry plane. The additional circuitry plane can be one of a ground plane, a power plane, an electrical connection to other circuit members, a dielectric layer, or a flexible circuit.

The contact members can be formed from one of a curable conductive material, sintered conductive particles, or a platable material. In one embodiment, the compliant printed circuit extends beyond a perimeter edge of a socket housing. In another embodiment, a flexible circuit member that is electrically coupled to the conductive traces extends beyond a perimeter edge of the socket housing.

At least one electrical device can be optionally printed on the compliant printed circuit and electrically coupled to one or more of the conductive traces. The electrical device can be selected from one of a shielding, a near device decoupling, a capacitor, a transistor, a resistor, a filter, a signal or power altering and enhancing device, a memory device, an embedded IC, a RF antennae, and the like. The electrical device can be preferably positioned within the socket housing.

The present disclosure is also directed to a test socket for testing IC devices. The test socket can include a compliant printed circuit with at least one compliant layer, a plurality of first contact members located along a first major surface, a plurality of second contact members located along a second major surface, and a plurality of conductive traces electrically coupling the first and second contact members. A socket housing can be coupled to the compliant printed circuit so the first contact members are positioned in a recess of the socket housing. An IC device can be positioned in the recess of the socket housing with terminals on the IC device compressively engaged with the first contact members. The compliant layer can bias the first contact members against the terminals on the IC device. A test PCB can be electrically coupled with the second contact members. The compliant layer can bias the second contact members against contact pads on the test PCB.

The IC device can be selected from one of a bare die device or a packaged IC device. A plurality of electrical devices can be preferably located in the test socket and electrically coupled to one or more of the conductive traces. The electrical devices can be preferably programmed to monitor performance of the IC device during a testing protocol.

In one embodiment, the test PCB can include a first test protocol and at least a second test protocol triggered by one or more of electrical devices located in the test socket. In one embodiment, a test protocol can signal the test PCB to modify the IC device.

The present disclosure is also directed to a method of making a test socket. A compliant printed circuit can be formed by printing a first base layer of a dielectric material onto a surface of a fixture. A conductive material can be deposited into a plurality of cavities or recesses in the fixture, such as for example by printing. The conductive material can be processed to form a plurality of first contact members along a first major surface of the compliant printed circuit. A compliant layer can be printed on the first base layer. A plurality of conductive traces can be printed onto an exposed surface of the compliant layer and electrically couple a plurality of the conductive traces with a one or more of the first contact members. A plurality of second contact members can be formed along a second major surface of the compliant printed circuit. The compliant printed circuit can be removed from the fixture and positioned in a socket housing so that the first contact members are located in a recess of the socket housing.

The present disclosure is also directed to a method of testing an IC device using the test sockets disclosed herein. An IC device can be located in the recess of the socket housing so that terminals on the IC device can electrically couple with the first contact members. The compliant layer can bias the first contact members against the terminals on the IC device. Second contact members can be electrically coupled with pads on a test PCB. The compliant layer can bias the second contact members against contact pads on the test PCB.

The method can include monitoring performance of the IC device during a testing protocol. In one embodiment, the test PCB can include a plurality of testing protocols. The method can include applying a second test protocol in response to performance of the IC device during a first test protocol. In another embodiment, at least one electrical device can be printed on the compliant printed circuit to monitor performance of the IC device during a testing protocol. A second test protocol can be applied in response to a signal from the electrical devices printed on the compliant printed circuit. The second test protocol can optionally modify the IC device, such as for example by altering software embedded thereon.

The present disclosure is also directed to a method of adaptive testing of IC devices using the test socket of the present disclosure. Electrical devices on the test socket monitor performance of the IC device being tested and signal the test PCB to modify the test protocol accordingly. The test station can also be signaled to modify the IC device.

DETAILED DESCRIPTION OF THE INVENTION

The present test sockets can be used to test semiconductor and other electrical devices having contact-to-contact spacing (pitch) on the order of less than about 1.0 millimeter ($1 \times 10^{-3}$ meter), and more preferably a pitch of less than about 0.7 millimeter, and most preferably a pitch of less than about 0.4 millimeter. Such fine pitch test sockets are especially useful for evaluating IC devices.

Figure 1:
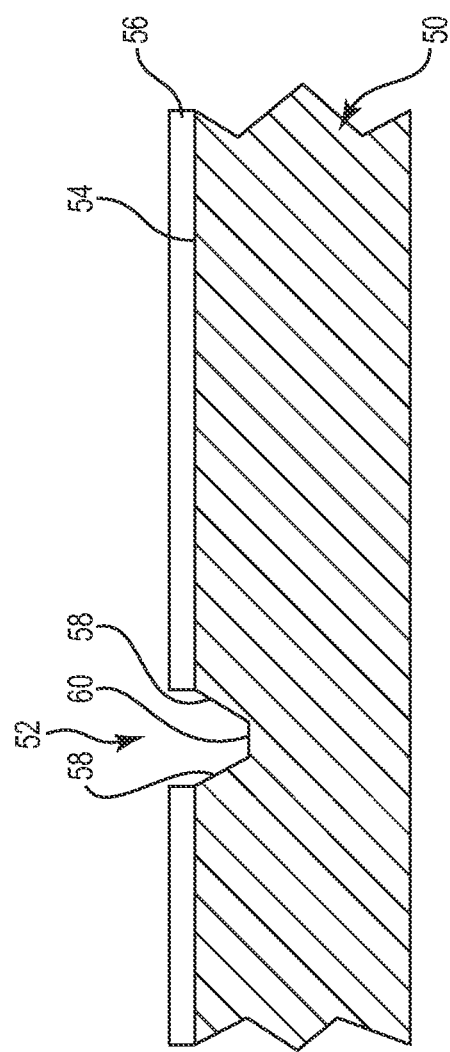
FIG. 1 is a cross-sectional view of a fixture for making a test socket in accordance with an embodiment of the present disclosure.

FIG. 1 is a side cross-sectional view of a fixture 50 useful in making a test socket in accordance with an embodiment of the present disclosure. The fixture 50 can include a plurality of cavities 52 (or recesses) in the first surface 54. The locations of the cavities 52 are arranged in an array that corresponds to terminals 62 on an IC device 64 (see FIG. 6). The cavities 52 can be formed using any of a variety of techniques, including but not limited to molding, machining, printing, imprinting, embossing, etching, coining, and the like.

In the illustrated embodiment, the cavities 52 include side surfaces 58 and generally flat bottom surface 60. The bottom surface 60 facilitates electrical coupling with terminals 62 on the IC device 64 and contact pads 66 on a PCB 68 (see FIG. 6). Although the cavities 52 are illustrated as truncated cones or pyramids, a variety of other shapes can be used, such as for example, cones, hemispherical shapes, and the like.

A base layer 56 can be preferably positioned on first surface 54 of the fixture 50. In one embodiment, the base layer 56 is printed onto the first surface 54, while leaving the cavities 52 exposed. In another embodiment, the base layer 56 is applied to the first surface 54 before the cavities 52 are formed, and the cavities 52 are formed through the base layer 56. In yet another embodiment, the base layer 56 extends along the surfaces 58, 60 of the cavities 52. The base layer 56 can facilitate removal of the compliant printed circuit 70 (see FIG. 6) from the fixture 50. The base layer 56 can be preferably a dielectric material that also acts as a carrier layer for the compliant printed circuit 70.

The fixture 50 can be constructed from a variety of materials, such as for example metal, plastic, ceramic, and composites thereof. In one embodiment, the fixture 50 is made from a resist material that can be dissolved to release a compliant printed circuit formed on the fixture 50. Making the fixture 50 from a dissolvable material permits contact members 72 (see FIG. 2) formed in the cavities 52 to have a variety of internal features, undercuts, or cavities that are difficult or typically not possible to make using conventional molding or machining techniques, referred to herein as a "non-moldable feature." The cavities 52 are optionally coated with a material to facilitate release of the contact members 72 from the fixture 50.

Figure 2:
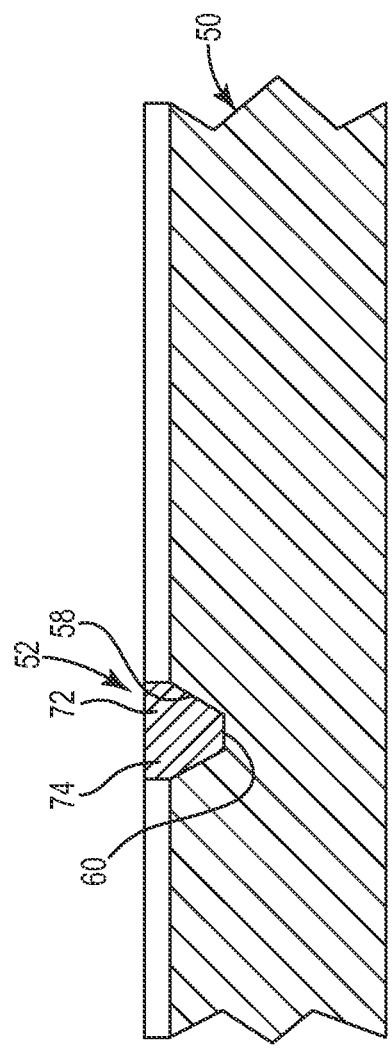
FIG. 2 illustrates contact members formed in the fixture of FIG. 1.

FIG. 2 illustrates contact member 72 formed in the fixture of FIG. 1. As illustrated in FIG. 2, conductive material 74 can be deposited in the cavities 52 to form contact members 72. In one embodiment, the conductive material 74 is a metallic powder that can be sintered to create the contact members 72 (see FIG. 6). In another embodiment, the conductive material 74 can be a flowable, curable conductive material.

In one embodiment, inner surface 58, 60 of the cavities 52 can be optionally pretreated before deposition of the conductive material 74. For example, the inner surfaces 58, 60 can be coated with particles of rhodium and then sintered. The sintered rhodium is then coated with nickel or copper. In another embodiment, the inner surfaces 58, 60 can be coated with a low friction material that facilitates removal of the contact members 72 (see FIG. 6) from the fixture 50.

The conductive material 74 is preferably deposited in a first state and then processed to create a second more permanent state. For example, the metallic powder can be deposited in the cavities 52 and subsequently sintered, or a curable conductive material can flow into the cavities 52 and can be subsequently cured. As used herein "cure" and inflections thereof refers to a chemical-physical transformation that allows a material to progress from a first form (e.g., flowable form) to a more permanent second form. "Curable" refers to an uncured material having the potential to be cured, such as for example by the application of a suitable energy source.

Various methods for deposition of electronic materials may be used to deposit the conductive material in the cavities, such as for example, inkjet printing, screen printing, aerosol printing, printing through a stencil, flexo-gravure printing, and offset printing.

Also, the compliant printed circuit 70 and various structures described herein are preferably manufactured using printing technology, such as for example, inkjet printing, aerosol printing, screen printing, printing through a stencil, flexo-gravure printing, and offset printing, rather than traditional PCB fabrication techniques. Various methods of printing the compliant printed circuit and the electrical devices are disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are incorporated herein by reference. For example, conductive inks containing metal particles are printed onto the compliant printed circuit 58 and subsequently sintered.

A printing process can preferably be used to fabricate various functional structures, such as conductive paths and electrical devices without the use of masks or resists. Features down to about 10 microns can be directly written in a wide variety of functional inks, including metals, ceramics, polymers and adhesives, on virtually any substrate—silicon, glass, polymers, metals and ceramics. The substrates can be planar and non-planar surfaces. The printing process is typically followed by a thermal treatment, such as in a furnace or with a laser, to achieve dense functionalized structures.

U.S. Pat. No. 6,506,438 (Duthaler et al.) and U.S. Pat. No. 6,750,473 (Amundson et al.), which are incorporated herein by reference, teach using inkjet printing to make various electrical devices, such as resistors, capacitors, diodes, inductors (or elements which can be used in radio applications or magnetic or electric field transmission of power or data), semiconductor logic elements, electro-optical elements, transistors (including, light emitting, light sensing or solar cell elements, field effect transistors, top gate structures), and the like.

U.S. Pat. No. 7,674,671 (Renn et al.); U.S. Pat. No. 7,658,163 (Renn et al.); U.S. Pat. No. 7,485,345 (Renn et al.); U.S. Pat. No. 7,045,015 (Renn et al.); and U.S. Pat. No. 6,823,124 (Renn et al.), which are hereby incorporated by reference, teach using aerosol printing to create various electrical devices and features.

Printing of electronically active inks can be done on a large class of substrates, without the requirements of standard vacuum processing or etching. The inks may incorporate mechanical, electrical or other properties, such as, conducting, insulating, resistive, magnetic, semiconductive, light modulating, piezoelectric, spin, optoelectronic, thermoelectric or radio frequency.

A plurality of ink drops are dispensed from the print head directly to a substrate or on an intermediate transfer member. The transfer member can be a planar or non-planar structure, such as a drum. The surface of the transfer member can be coated with a non-sticking layer, such as silicone, silicone rubber, or teflon.

The ink (also referred to as function inks) can include conductive materials, semi-conductive materials (e.g., p-type and n-type semiconducting materials), metallic material, insulating materials, and/or release materials. The ink pattern can be deposited in precise locations on a substrate to create fine lines having a width smaller than 10 microns, with precisely controlled spaces between the lines. For example, the ink drops form an ink pattern corresponding to portions of a transistor, such as a source electrode, a drain electrode, a dielectric layer, a semiconductor layer, or a gate electrode.

The substrate can be an insulating polymer, such as polyethylene terephthalate (PET), polyester, polyethersulphone (PES), polyimide film (e.g. Kapton, available from Dupont located in Wilmington, Del.; Upilex available from Ube Corporation located in Japan), or polycarbonate. Alternatively, the substrate can be made of an insulator such as undoped silicon, glass, or a plastic material. The substrate can also be patterned to serve as an electrode. The substrate can further be a metal foil insulated from the gate electrode by a non-conducting material. The substrate can also be a woven material or paper, planarized or otherwise modified on at least one surface by a polymeric or other coating to accept the other structures.

Electrodes can be printed with metals, such as aluminum or gold, or conductive polymers, such as polythiophene or polyaniline. The electrodes may also include a printed conductor, such as a polymer film comprising metal particles, such as silver or nickel, a printed conductor comprising a polymer film containing graphite or some other conductive carbon material, or a conductive oxide such as tin oxide or indium tin oxide.

Dielectric layers can be printed with a silicon dioxide layer, an insulating polymer, such as polyimide and its derivatives, poly-vinyl phenol, polymethylmethacrylate, polyvinylidenedifluoride, an inorganic oxide, such as metal oxide, an inorganic nitride such as silicon nitride, or an inorganic/organic composite material such as an organic-substituted silicon oxide, or a sol-gel organosilicon glass. Dielectric layers can also include a bicylcobutene derivative (BCB) available from Dow Chemical (Midland, Mich.), spin-on glass, or dispersions of dielectric colloid materials in a binder or solvent.

Semiconductor layers can be printed with polymeric semiconductors, such as, polythiophene, poly(3-alkyl)thiophenes, alkyl-substituted oligothiophene, polythienylenevinylene, poly(para-phenylenevinylene) and doped versions of these polymers. An example of suitable oligomeric semiconductor is alpha-hexathienylene. Horowitz, Organic Field-Effect Transistors, Adv. Mater., 10, No. 5, p. 365 (1998) describes the use of unsubstituted and alkyl-substituted oligothiophenes in transistors. A field effect transistor made with regioregular poly(3-hexylthiophene) as the semiconductor layer is described in Bao et al., Soluble and Processable Regioregular Poly(3-hexylthiophene) for Thin Film Field-Effect Transistor Applications with High Mobility, Appl. Phys. Lett. 69 (26), p. 4108 (December 1996). A field effect transistor made with a-hexathienylene is described in U.S. Pat. No. 5,659,181 (Bridenbaugh et al.), which is incorporated herein by reference.

A protective layer can optionally be printed onto the electrical devices and features. The protective layer can be an aluminum film, a metal oxide coating, a polymeric film, or a combination thereof.

Organic semiconductors can be printed using suitable carbon-based compounds, such as, pentacene, phthalocyanine, benzodithiophene, buckminsterfullerene or other fullerene derivatives, tetracyanonaphthoquinone, and tetrakisimethylanimoethylene. The materials provided above for forming the substrate, the dielectric layer, the electrodes, or the semiconductor layer are exemplary only. Other suitable materials known to those skilled in the art having properties similar to those described above can be used in accordance with the present invention.

An inkjet print head, or other print head, preferably includes a plurality of orifices for dispensing one or more fluids onto a desired media, such as for example, a conducting fluid solution, a semiconducting fluid solution, an insulating fluid solution, and a precursor material to facilitate subsequent deposition. The precursor material can be surface active agents, such as octadecyltrichlorosilane (OTS).

Alternatively, a separate print head is used for each fluid solution. The print head nozzles can be held at different potentials to aid in atomization and imparting a charge to the droplets, such as disclosed in U.S. Pat. No. 7,148,128 (Jacobson), which is hereby incorporated by reference. Alternate print heads are disclosed in U.S. Pat. No. 6,626,526 (Ueki et al.), and U.S. Pat. Publication Nos. 2006/0044357 (Andersen et al.) and 2009/0061089 (King et al.), which are hereby incorporated by reference.

The print head preferably uses a pulse-on-demand method, and can employ one of the following methods to dispense the ink drops: piezoelectric, magnetostrictive, electromechanical, electropneumatic, electrostatic, rapid ink heating, magnetohydrodynamic, or any other technique well known to those skilled in the art. The deposited ink patterns typically undergo a curing step or another processing step before subsequent layers are applied.

While inkjet printing is preferred, the term "printing" is intended to include all forms of printing and coating, including: premetered coating such as patch die coating, slot or extrusion coating, slide or cascade coating, and curtain coating; roll coating such as knife over roll coating, forward and reverse roll coating; gravure coating; dip coating; spray coating; meniscus coating; spin coating; brush coating; air knife coating; screen printing processes; electrostatic printing processes; thermal printing processes; aerosol printing processes; and other similar techniques.

Figure 3:
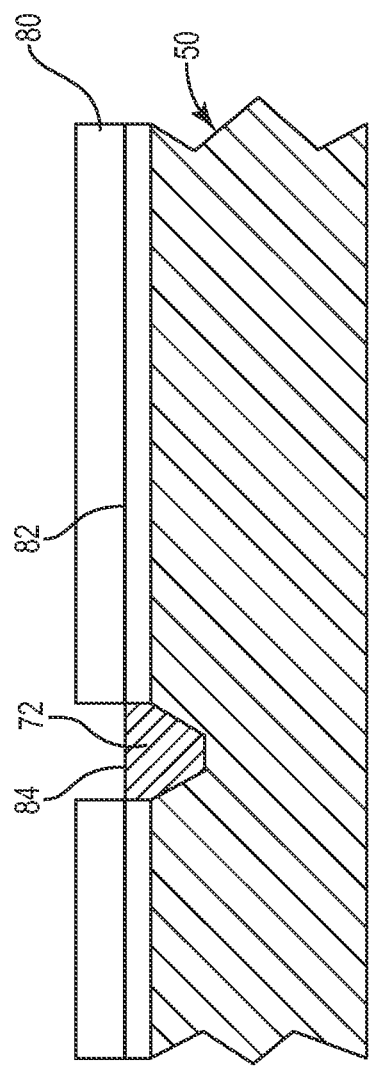
FIG. 3 illustrates a compliant layer added to the assembly of FIG. 2.

FIG. 3 illustrates a first compliant layer 80 selectively applied to a surface 82 of the base layer 56. The compliant layer 80 can be preferably printed onto the surface 82 using a printing technology as previously described. A rear surface 84 of the conductive material 74 can be left exposed to permit subsequent processing, such as for example electrically coupling to the contact member 72.

Figure 4:
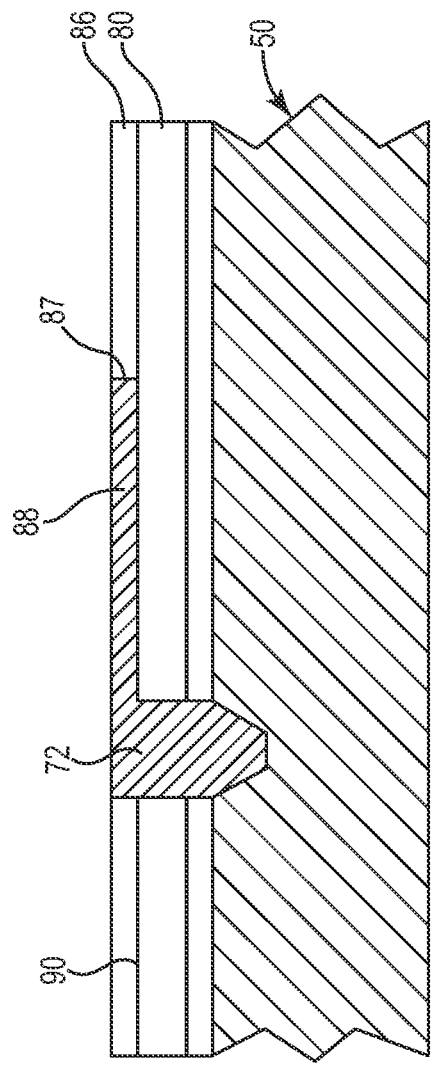
FIG. 4 illustrates conductive traces coupled to the contact members of FIG. 3.

FIG. 4 illustrates dielectric layers 86 and conductive traces 88 deposited, such as by printing, on the top surface 90 of the first compliant layer 80. In one embodiment, the conductive traces 88 can be created by sintering or by printing a platable target that can be subsequently plated with a conductive material. In one embodiment, the plating can be optionally applied using printing technology. Digital images of the dielectric layers 86 and conductive traces 88 are printed directly on the surface 90, eliminating or reducing many of the lithography, plating, and etching steps used to manufacture conventional probes. The resulting compliant printed circuit 70 (see FIG. 6) can provide high frequency capability.

Inkjet and other printing processes are additive in nature. The additive nature provides an excellent means to form layers of the compliant printed circuit 70 (shown in FIG. 6), such as for example dielectric layers covering the electrical traces, power planes, ground planes, and the like. Printing processes such as inkjet printing can also be use to print desired functions or electrical devices directly on the compliant printed circuit 70 (see FIG. 6), rather than mounting the electrical devices discretely. Digital images of the dielectric layers, conductive traces, and electrical devices and features can be printed directly on a surface of the fixture 50 or of a previously applied layer, eliminating or reducing many of the lithography, plating, and etching steps conventionally used. The resulting compliant printed circuit 70 (see FIG. 6) can provide high frequency capability. Moreover, the inkjet printing process can reduce manufacturing production time and cost by orders of magnitude.

The use of additive printing processes can permit a wide variety of materials to be applied on a layer with a registration relative to the features of the previous layer. Selective addition of conductive, non-conductive, or semi-conductive materials at precise locations to create a desired effect can offer advantages in tuning impedance or adding electrical function on a given layer. Tuning performance on a layer by layer basis relative to the previous layer can greatly enhance electrical performance.

The resulting conductive traces 88 preferably have substantially rectangular cross-sectional shapes. The use of additive printing processes permits conductive material, non-conductive material, and semi-conductive material to be simultaneously located on a single layer.

In one embodiment, recesses 87 (or trenches) formed in an applied layer, such as the compliant layer 80 and the dielectric layer 86, can permit control of the location, cross section, material content, and aspect ratio of the contact members 72 and the conductive traces 88. Maintaining the conductive traces 88 with a cross-section of 1:1 or greater can provide greater signal integrity than traditional subtractive trace forming technologies. For example, traditional methods take a sheet of a given thickness and etch the material between the traces away to have a resultant trace that is usually wider than it is thick. The etching process also removes more material at the top surface of the trace than at the bottom, leaving a trace with a trapezoidal cross-sectional shape, degrading signal integrity in some applications. Using recesses to control the aspect ratio of the conductive traces 88 can result in a more rectangular or square cross-section of the conductive traces 88, with a corresponding improvement in signal integrity.

In another embodiment, pre-patterned or pre-etched thin conductive foil circuit traces can be transferred to the recesses 87. For example, a pressure sensitive adhesive can be used to retain the copper foil circuit traces in the recesses 87. The trapezoidal cross-sections of the pre-formed conductive foil traces are then post-plated. The plating material fills the open spaces in the recesses 87, resulting in a substantially rectangular or square cross-sectional shape corresponding to the shape of the recesses 87.

In another embodiment, a thin conductive foil is pressed into the recesses 87, and the edges of the recesses 87 act to cut or shear the conductive foil. The process positions a portion of the conductive foil in the recesses 87, but leaves the negative pattern of the conductive foil not wanted outside and above the recesses 87 for easy removal. Again, the foil in the recesses 87 is preferably post plated to add material to increase the thickness of the conductive traces 88 and to fill any voids left between the conductive foil and the recesses 87.

Figure 5:
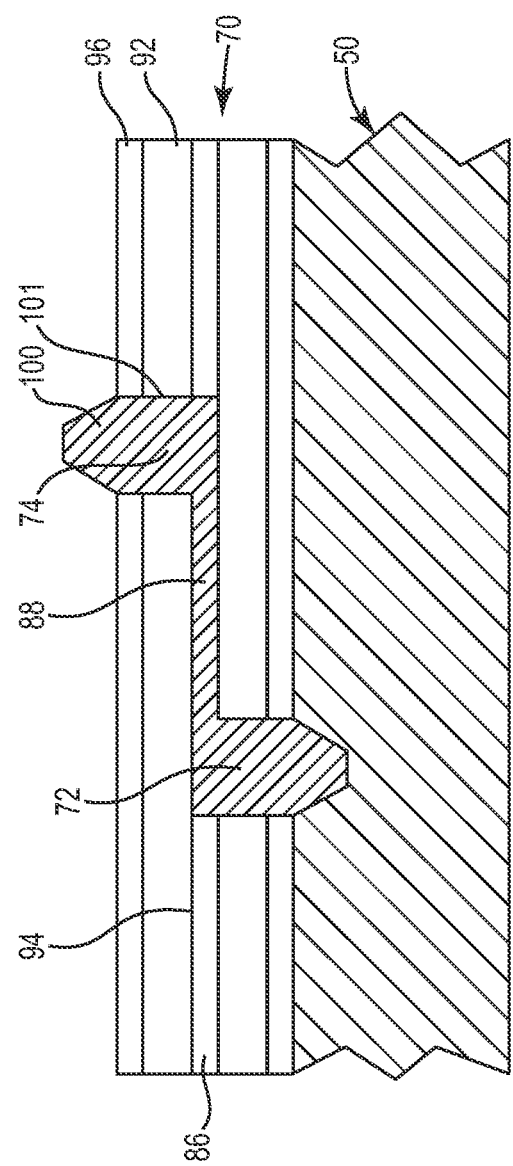
FIG. 5 illustrates a second compliant layer, a dielectric layer, and a contact member added to the assembly of FIG. 4.

FIG. 5 illustrates the remaining process of fabricating the compliant printed circuit 70 in accordance with an embodiment of the present disclosure. A second compliant layer 92 is positioned on exposed surfaces 94 of the dielectric layers 86 and conductive traces 88. The second compliant layer 92 and second dielectric layer 96 can be selectively deposited on the exposed surfaces 94 to permit creation of a contact member 100.

The contact member 100 can be preferably created using the techniques discussed in connection with contact member 72. In one embodiment, cavities 101 in the second compliant layer 92 and the second dielectric layer 96 can be filed with conductive material 74. A second fixture with second contact members 100, such as illustrated in FIG. 2, can be positioned so the second contact members 100 bond with the conductive material 74 such as during sintering or curing.

Alternatively, a pre-fabricated contact member 100 can be bonded to the conductive trace 88. As used herein, "bond" or "bonding" refers to, for example, adhesive bonding, solvent bonding, ultrasonic welding, thermal bonding, or any other techniques suitable for attaching adjacent layers of a substrate.

In another embodiment, the compliant printed circuit 70 can be made in two portions, such as illustrated in FIGS. 3 and 4, and then bonded together.

Figure 6:
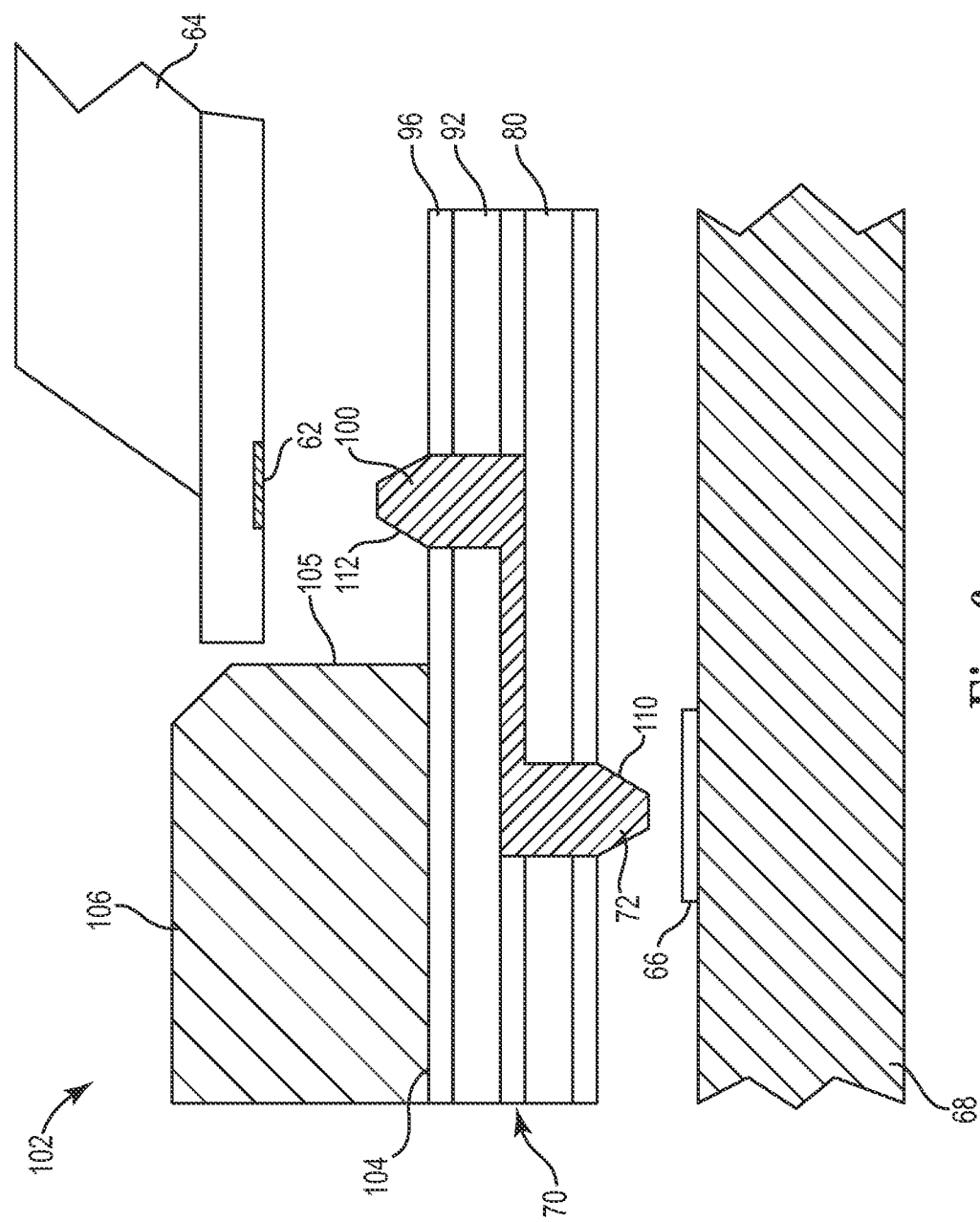
FIG. 6 is a test socket in accordance with an embodiment of the present disclosure.

FIG. 6 is a test socket 102 in accordance with an embodiment of the present disclosure. The compliant printed circuit 70 is removed from the fixture 50 (shown in FIGS. 1-5). In the illustrated embodiment, the dielectric layer 96 can be bonded to a surface 104 of a socket housing 106 so that contact members 100 are positioned in a recess 105 formed by the socket housing 106. The IC device 64 can be positioned in the recess 105 so that terminals 62 on the IC device 64 align with the contact members 100.

Exposed surfaces 110, 112 of the contact members 72, 100, can be optionally plated, either before or after the compliant printed circuit 70 is installed in the socket housing 106. In another embodiment, the contact members 72, 100 can be deformed, such as for example by coining or etching, to facilitate engagement with terminals 62 on the IC device 64.

Although the present test socket 102 is particularly well suited for testing packaged IC devices, it can be used on a variety of other circuit members, such as for example, unpackaged integrated circuits, printed circuit boards, flexible circuits, bare-die devices, organic or inorganic substrates, or any other device capable of carrying electrical current.

In operation, the IC device 64, the test socket 102 and a PCB 68 are compressively coupled so that the contact member 100 electrically couples with the terminal 62 and the contact member 72 electrically couples with a contact pad 66 on the PCB. A compliant layer 80 can bias the contact member 100 into engagement with the terminal 62, while the compliant layer 92 can bias the contact member 72 into engagement with the contact pad 66. The compliant layers 80, 92 can also permit the contact members 72, 100 to deflect and thereby compensate for non-planarity of the terminals 62 or the contact pads 66.

Figure 7:
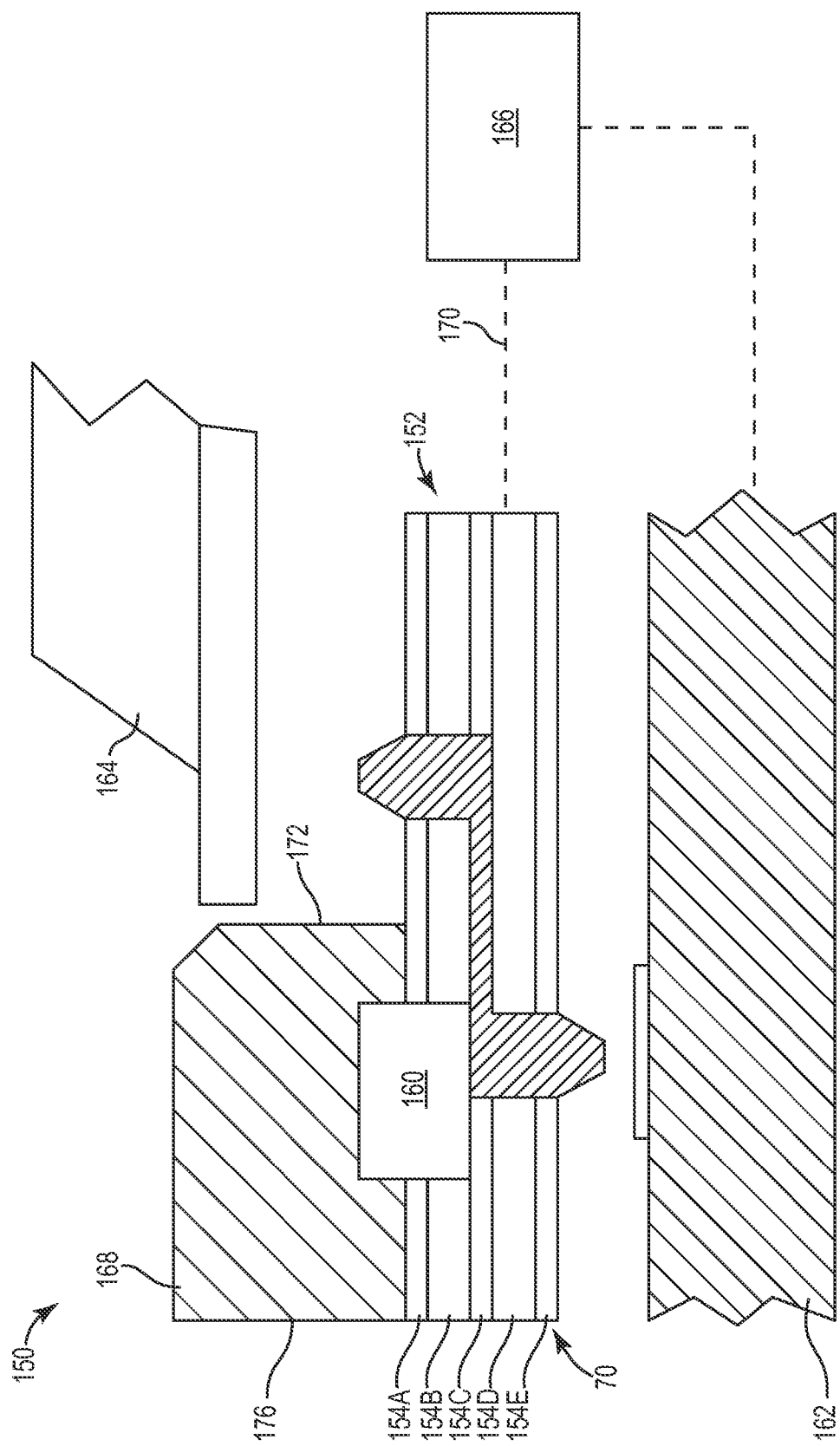
FIG. 7 is a test socket having additional functionality in accordance with an embodiment of the present disclosure.

FIG. 7 is an alternate test socket 150 with additional functionality built into the compliant printed circuit 152 in accordance with an embodiment of the present disclosure. One or more of the layers 154A, 154B, 154C, 154D, and 154E (collectively "154") can include additional functionality, such as for example, specialty dielectrics, ground planes, power planes, shielding layers, stiffening layers, capacitive coupling features, circuitry layers, and the like. The layers 154 can be printed or preformed and selectively bonded or non-bonded to provide contiguous material or releasable layers.

The additional functionality can also be provided by additional electrical devices 160, preferably positioned adjacent to a recess 172 of a socket housing 168 that receives the IC device 164. The electrical devices 160 can be shielding, near device decoupling, capacitors, transistors, resistors, filters, signal or power altering and enhancing devices, memory devices, embedded IC, RF antennae, and the like. The electrical devices 160 can be added as discrete components or printed onto one of the layers. The electrical devices 160 can include passive or active functional elements. Passive structure refers to a structure having a desired electrical, magnetic, or other property, including but not limited to a conductor, resistor, capacitor, inductor, insulator, dielectric, suppressor, filter, varistor, ferromagnet, and the like.

In a preferred embodiment, the electrical devices 160 are printed onto the compliant printed circuit 70. As previously explained, various methods of printing electrical devices are disclosed in U.S. Pat. No. 7,485,345 (Renn et al.); U.S. Pat. No. 7,382,363 (Albert et al.); U.S. Pat. No. 7,148,128 (Jacobson); U.S. Pat. No. 6,967,640 (Albert et al.); U.S. Pat. No. 6,825,829 (Albert et al.); U.S. Pat. No. 6,750,473 (Amundson et al.); U.S. Pat. No. 6,652,075 (Jacobson); U.S. Pat. No. 6,639,578 (Comiskey et al.); U.S. Pat. No. 6,545,291 (Amundson et al.); U.S. Pat. No. 6,521,489 (Duthaler et al.); U.S. Pat. No. 6,459,418 (Comiskey et al.); U.S. Pat. No. 6,422,687 (Jacobson); U.S. Pat. No. 6,413,790 (Duthaler et al.); U.S. Pat. No. 6,312,971 (Amundson et al.); U.S. Pat. No. 6,252,564 (Albert et al.); U.S. Pat. No. 6,177,921 (Comiskey et al.); U.S. Pat. No. 6,120,588 (Jacobson); U.S. Pat. No. 6,118,426 (Albert et al.); and U.S. Pat. Publication No. 2008/0008822 (Kowalski et al.), which are hereby incorporated by reference. Electrical devices that are typically located on a separate test station or on a test PCB 162 can be incorporated into the test socket 150, and thereby improve electrical performance. Electrical devices 160 can also be positioned within the socket housing 168.

In one embodiment, the compliant printed circuit 152 extends beyond a perimeter edge 176 of the socket housing 168. In one embodiment, an extension 170 including a flexible circuit member can be electrically coupled to the compliant printed circuit 152. In the illustrated embodiment, the compliant printed circuit 152 is electrically coupled to a test station 166 via the extension 170. Alternatively, the test PCB 162 can be electrically coupled to the test station 166.

The testing protocol can reside on the test PCB 162, the test station 166, or a combination thereof. Reference herein to the test PCB should be construed to encompass the test station, either coupled to the test PCB or directly to the compliant printed circuit.

In one embodiment, the electrical devices 160 monitor the testing of the IC device 164 and communicate feedback to test station 166. In one embodiment, the feedback signal from the electrical devices 160 can cause the test station 166 to alter the testing protocol based on the performance of the IC device 164. This can be referred to as adaptive testing. In one embodiment, the feedback signal from the electrical devices 160 can cause the test station 166 to alter the IC device 164, such as for example, by altering software resident on the IC device 164.

Figure 8:
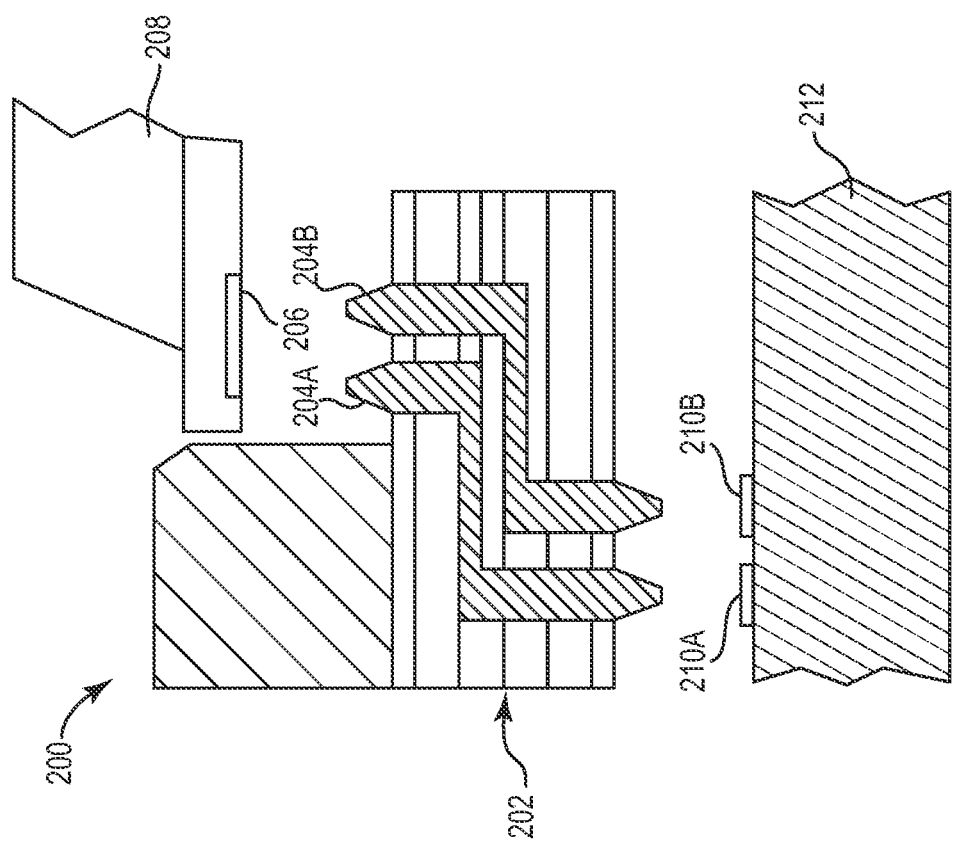
FIG. 8 is a test socket with redundant contact members in accordance with an embodiment of the present disclosure.

FIG. 8 is a test socket 200 in accordance with another embodiment of the present disclosure. The compliant printed circuit 202 can include multiple contacts 204A, 204B (collectively "204") for each terminal 206 on an IC device 208. The redundant contacts 204 can increase reliability and permit Kelvin measurements, which require two separate contact points at the terminal 206 of the IC device 208 routed to separate pads 210A, 210B (collectively "210") on the test PCB 212.

Figure 9:
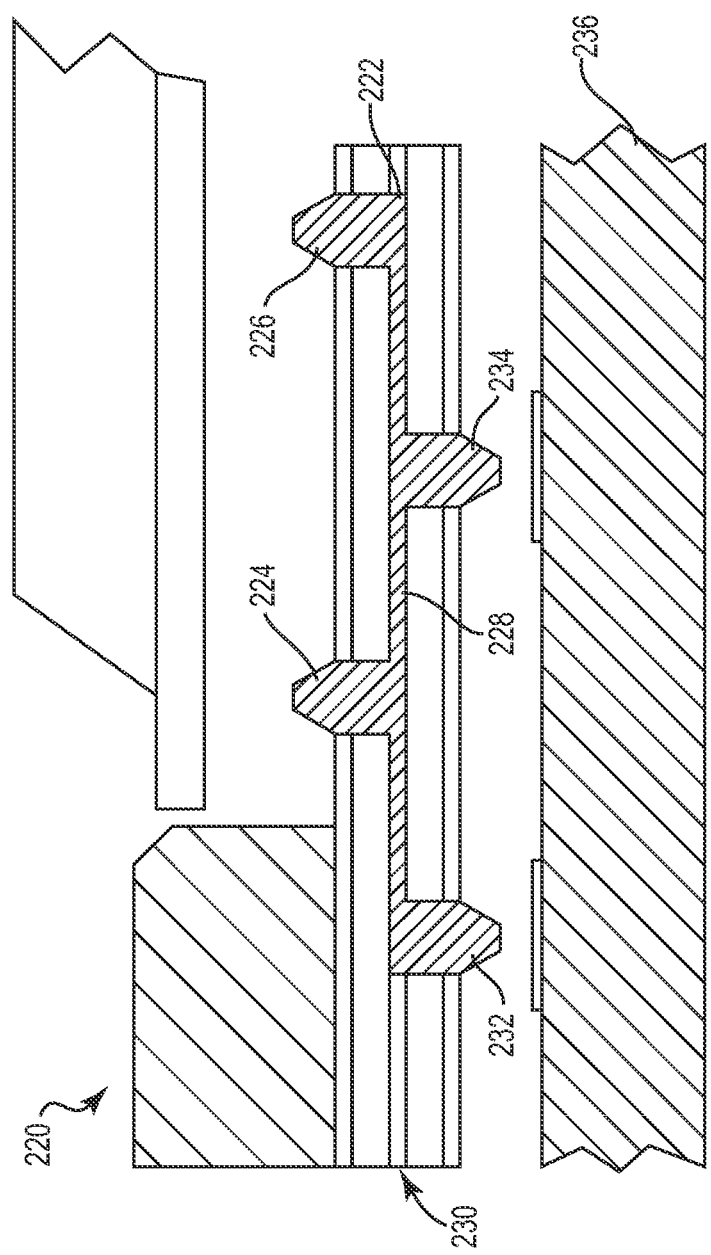
FIG. 9 is a test socket with a common ground plane in accordance with an embodiment of the present disclosure.

FIG. 9 is a test socket 220 with common ground plane 222 in accordance with another embodiment of the present disclosure. Grounding contact members 224, 226 can be coupled to a common conductive trace 228 in the compliant printed circuit 230. The conductive trace 228 functions as a grounding plane 222. The grounding contact members 232, 234 can connect the ground plane 222 to a test PCB 236.

Figure 10:
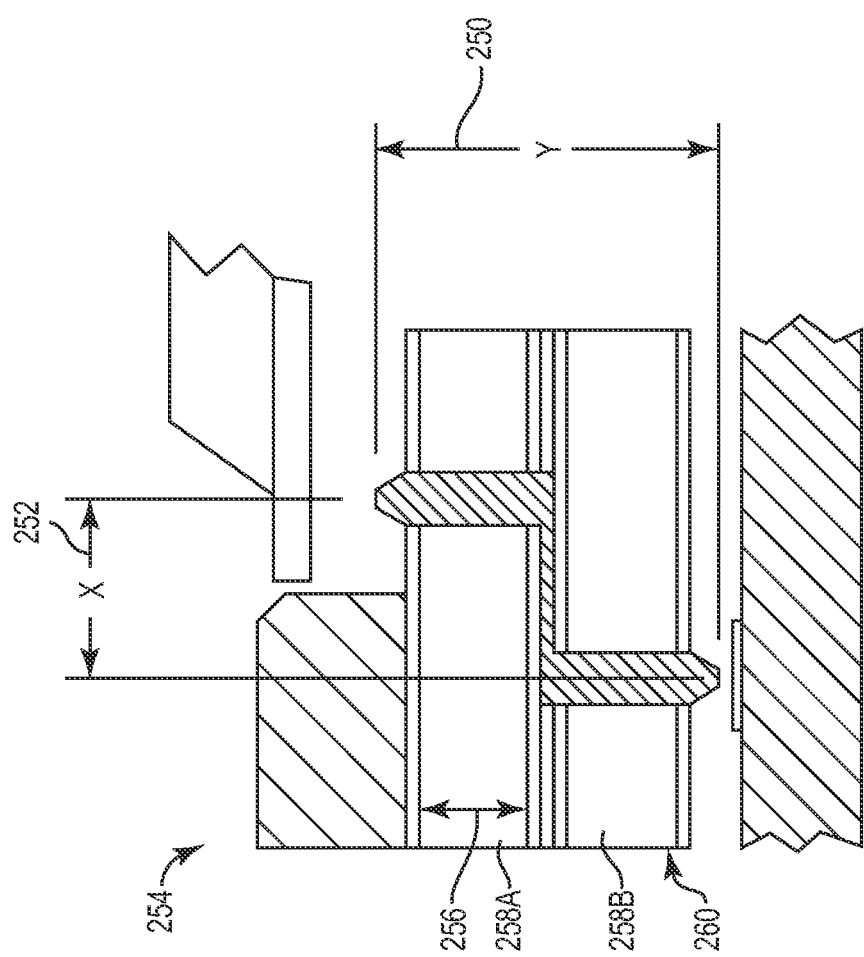
FIG. 10 is a test socket having adjusted contact height and lateral offset in accordance with an embodiment of the present disclosure.

FIG. 10 is a test socket 254 having adjusted contact height 250 and lateral offset 252, in accordance with an embodiment of the present disclosure. FIG. 10 illustrates the adaptive capabilities of the present disclosure by showing an ability to adjust contact height 250 and lateral offset 252 of test sockets 254. Increasing thickness 256 of one or both of the compliant layers 258A, 258B can permit the contact height 250 to be adjusted. Increasing the depth of the cavities 52 in the fixture 50 (see FIG. 1) can also be used to modify the contact height 250. The printing technology used to create the compliant printed circuit 260 allows lateral offset 252 to be easily adjust. Consequently, compliant printed circuits in accordance with various embodiments of the present disclosure can be adapted for use in existing socket designs.

Figure 11:
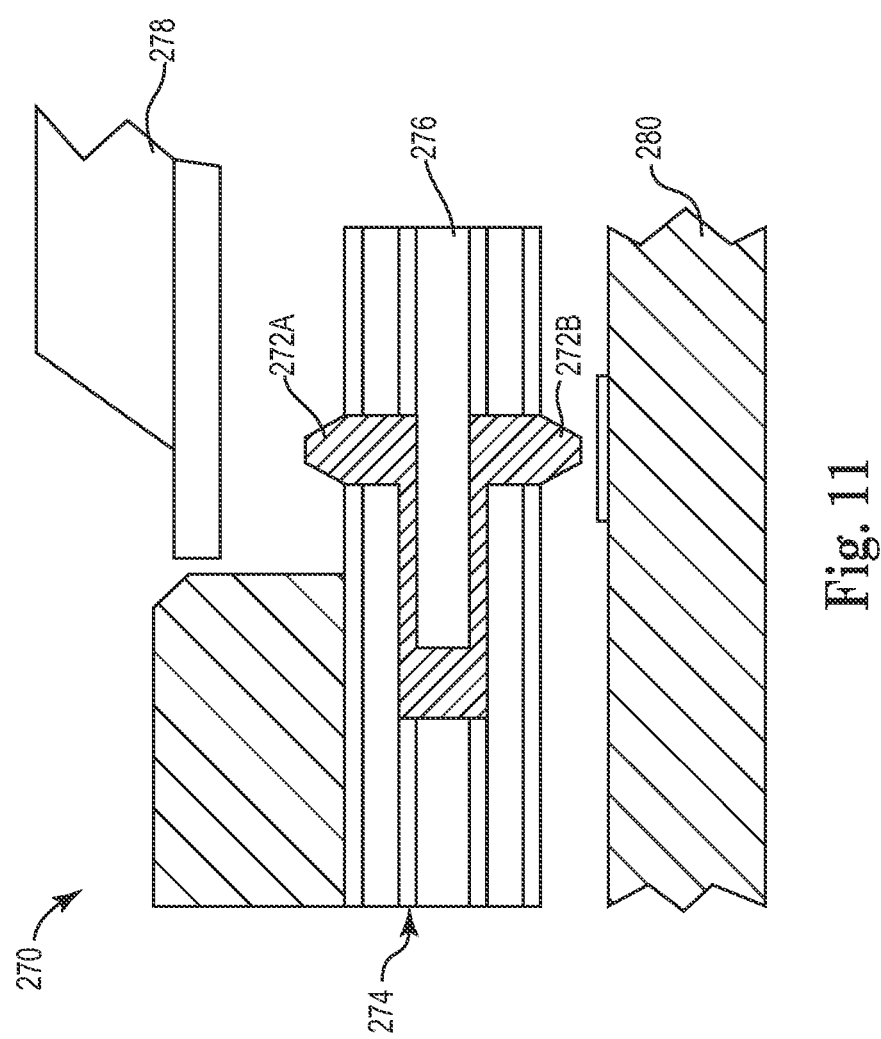
FIG. 11 is a test socket with relocated or rerouted contact members in accordance with an embodiment of the present disclosure.

FIG. 11 is a test socket 270 with relocated or rerouted contact members 272A, 272B (collectively "272") in accordance with an embodiment of the present disclosure. The test socket 270 illustrates one of various routing options of contact members of a test socket. A compliant printed circuit 274 can permit the contact members 272 to be arranged in various configurations. In the embodiment of FIG. 11, the compliant layer 276 can simultaneously bias the contact member 272A toward an IC device 278 and the contact member 272B toward the test PCB 280.

Where a range of values is provided, it is understood that each intervening value, to the tenth of the unit of the lower limit unless the context clearly dictates otherwise, between the upper and lower limit of that range and any other stated or intervening value in that stated range is encompassed within the embodiments of the invention. The upper and lower limits of these smaller ranges which may independently be included in the smaller ranges is also encompassed within the embodiments of the invention, subject to any specifically excluded limit in the stated range. Where the stated range includes one or both of the limits, ranges excluding either both of those included limits are also included in the embodiments of the invention.

Unless defined otherwise, all technical and scientific terms used herein have the same meaning as commonly understood by one of ordinary skill in the art to which the embodiments of the present disclosure belong. Although any methods and materials similar or equivalent to those described herein can also be used in the practice or testing of the embodiments of the present disclosure, the preferred methods and materials are now described. All patents and publications mentioned herein, including those cited in the Background of the application, are hereby incorporated by reference to disclose and described the methods and/or materials in connection with which the publications are cited.

The publications discussed herein are provided solely for their disclosure prior to the filing date of the present application. Nothing herein is to be construed as an admission that the embodiments of the present invention are not entitled to antedate such publication by virtue of prior invention. Further, the dates of publication provided may be different from the actual publication dates which may need to be independently confirmed.

Other embodiments of the invention are possible. Although the description above contains much specificity, these should not be construed as limiting the scope of the invention, but as merely providing illustrations of some of the presently preferred embodiments of this invention. It is also contemplated that various combinations or sub-combinations of the specific features and aspects of the embodiments may be made and still fall within the scope of the present disclosure. It should be understood that various features and aspects of the disclosed embodiments can be combined with or substituted for one another in order to form varying modes of the disclosed embodiments of the invention. Thus, it is intended that the scope of at least some of the present invention herein disclosed should not be limited by the particular disclosed embodiments described above.

Thus the scope of this invention should be determined by the appended claims and their legal equivalents. Therefore, it will be appreciated that the scope of the present invention fully encompasses other embodiments which may become obvious to those skilled in the art, and that the scope of the present invention is accordingly to be limited by nothing other than the appended claims, in which reference to an element in the singular is not intended to mean "one and only one" unless explicitly so stated, but rather "one or more." All structural, chemical, and functional equivalents to the elements of the above-described preferred embodiment(s) that are known to those of ordinary skill in the art are expressly incorporated herein by reference and are intended to be encompassed by the present claims. Moreover, it is not necessary for a device or method to address each and every problem sought to be solved by the present invention, for it to be encompassed by the present claims. Furthermore, no element, component, or method step in the present disclosure is intended to be dedicated to the public regardless of whether the element, component, or method step is explicitly recited in the claims.

What is claimed is:

1. A method of making a test socket comprising the steps of:
    forming a compliant printed circuit comprising the steps of:
        printing a first base layer of a dielectric material onto a surface of a fixture;
        plating a conductive material into a plurality of cavities in the fixture;
        processing the conductive material to form a plurality of first contact members positioned along a first major surface of the compliant printed circuit;
        printing a compliant layer on the first base layer;
        forming a plurality of conductive traces on an exposed surface of the compliant layer and electrically coupling the plurality of the conductive traces with a one or more of the plurality of first contact members;
        printing a plurality of second contact members positioned along a second major surface of the compliant printed circuit and electrically coupling one or more of the second contact members to the conduct traces;
        removing the compliant printed circuit from the fixture; and
    positioning the compliant printed circuit in a socket housing so the first contact members are located in a recess of the socket housing, so that the compliant layer biases the first contact members into the recess.

2. The method of claim 1, wherein forming the conductive traces comprises depositing a plating onto an exposed surface.

3. The method of claim 1, wherein the conductive traces comprise substantially rectangular cross-sectional shapes.

4. The method of claim 1, further comprising plating a conductive material, printing a non-conductive material, and plating a semi-conductive material on a single layer of the compliant printed circuit.

5. The method of claim 1, wherein forming the plurality of conductive traces comprises:
    positioning pre-formed conductive trace materials in recesses of in the compliant layer; and
    plating the recesses of the base layer to form conductive traces with substantially rectangular cross-sectional shapes.

6. The method of claim 1, wherein forming the plurality of conductive traces comprises:
    pressing a conductive foil into at least a portion of recesses in the compliant layer;
    shearing the conductive foil along edges of the recesses;
    removing excess conductive foil not located in the recesses; and
    plating the recesses to form conductive traces with substantially rectangular cross-sectional shapes.

7. The method of claim 1, further comprising the steps of:
    plating a conductive material into a plurality of the cavities in the compliant layer; and processing the conductive material to form the plurality of second contact members positioned along the second major surface of the compliant printed circuit.

8. The method of claim 1, wherein the step of forming a plurality of second contact members comprises the steps of:
- printing a second base layer of a dielectric material onto a surface of a fixture;
- plating a conductive material into a plurality of the cavities in the fixture;
- processing the conductive material to form a plurality of second contact members; and
- coupling the second contact members with the conductive traces on the compliant printed circuit so the second contact members extend along the second major surface of the compliant printed circuit.

9. The method of claim 1, further comprising the step of forming at least one additional circuitry plane in the compliant printed circuit.

10. The method of claim 1, further comprising electrically coupling a flexible circuit member to the compliant printed circuit and extending the flexible circuit member beyond a perimeter edge of the socket housing.

11. The method of claim 1, further comprising the steps of:
- printing at least one electrical device on the compliant printed circuit; and
- electrically coupling the printed electrical device to at least one contact member.

12. A method of claim 1 comprising the steps of:
- positioning an integrated circuit (IC) device in the recess of the socket housing such that terminals on the IC device electrically couple with the plurality of first contact members, the compliant layer biasing the first contact members against the terminals on the IC device; and
- electrically coupling the plurality of second contact members with pads on a test printed circuit board (PCB), the compliant layer biasing the plurality of second contact members against the contact pads.

13. The method of claim 12, further comprising at least one electrical device printed on the compliant printed circuit monitoring performance of the IC device during a testing protocol.

14. The method of claim 12, further comprising modifying the IC device in response to results from the testing protocol.

15. The method of claim 12, further comprising monitoring performance of the IC device during a testing protocol.

16. The method of claim 15, wherein the test PCB comprises a plurality of testing protocols, the method comprising applying a second test protocol in response to performance of the IC device during a first test protocol.

17. The method of claim 15, further comprising applying a second test protocol in response to a signal from the electrical device printed on the compliant printed circuit.

* * * * *